United States Patent
Modi et al.

(10) Patent No.: US 10,924,096 B1
(45) Date of Patent: Feb. 16, 2021

(54) CIRCUIT AND METHOD FOR DYNAMIC CLOCK SKEW COMPENSATION

(71) Applicant: Xilinx, Inc., San Jose, CA (US)

(72) Inventors: Gourav Modi, Dublin (IE); Chee Chong Chan, Singapore (SG); Azarudin Abdulla, Singapore (SG); Riyas Noorudeen Remla, Singapore (SG)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/808,053

(22) Filed: Mar. 3, 2020

(51) Int. Cl.
| | |
|---|---|
| H03K 5/135 | (2006.01) |
| H05K 1/02 | (2006.01) |
| G06F 1/10 | (2006.01) |
| H03K 5/00 | (2006.01) |

(52) U.S. Cl.
CPC .......... H03K 5/135 (2013.01); G06F 1/10 (2013.01); H05K 1/0231 (2013.01); *H03K 2005/00026* (2013.01); *H03K 2005/00286* (2013.01)

(58) Field of Classification Search
CPC ......... H03K 5/135; H03K 2005/00026; H03K 2005/00286; G06F 1/10; H05K 1/0231
USPC ................................. 375/371, 372
See application file for complete search history.

(56) References Cited

U.S. PATENT DOCUMENTS

| | | | | |
|---|---|---|---|---|
| 9,832,006 | B1 * | 11/2017 | Bandi | H04L 7/0008 |
| 2020/0301466 | A1 * | 9/2020 | Kashiwagi | G06F 1/08 |

OTHER PUBLICATIONS

Xilinx, Versal Architecture and Product Data Sheet: Overview, DS950 (v1.3), retrieved online from <https://www.xilinx.com/support/documentation/data_sheets/ds950-versal-overview.pdf> on Dec. 2019, published on Jul. 3, 2019, 23 pages.

Suraj Kumar Saw, Preetisudha Meher, Swarnendu Chakraborty, Design of high frequency D flip flop circuit for phase detector application, retrieved online from <https://www.researchgate.net/publication/322213871_Design_of_high_frequency_D_flip_flop_circuit_for_phase_detector_application> on Dec. 2019 Proc. of the 2017 IEEE Region 10 Conference (TENCON), Malaysia, Nov. 5-8, 2017, 5 pages.

(Continued)

*Primary Examiner* — Fitwi Y Hailegiorgis
(74) *Attorney, Agent, or Firm* — Craige Thompson, Thompson Patent Law

(57) ABSTRACT

Apparatus and associated methods relate to a dynamic lane-to-lane skew reduction technique having (a) a clocking architecture configured to provide a corresponding first delayed clock signal and a corresponding second delayed clock signal through a first and a second plurality of routing traces, respectively, and (b) a number of skew compensation circuits configured to process the corresponding first delayed clock signal and the corresponding second delayed clock signal to generate a corresponding user clock signal for a corresponding lane of a transmitter. In an illustrative example, a first routing trace may transmit a first delayed clock signal in a direction opposite to a second routing trace transmitting a second delayed clock signal. By implementing the technique, each transmitter lane may receive a corresponding user clock signal having substantially the same delay relative to a reference clock signal such that dynamic lane-to-lane skew may be advantageously reduced.

20 Claims, 14 Drawing Sheets

(56) References Cited

OTHER PUBLICATIONS

Intel, Intel® Arria® 10 Transceiver PHY User Guide, Updated for Intel® Quartus® Prime Design Suite: 19.1, retrieved online from <https://www.intel.com/content/dam/www/programmable/us/en/pdfs/literature/hb/arria-10/ug_arria10_xcvr_phy.pdf> on Dec. 2019, 615 pages.
Xilinx, 7 Series FPGAs GTX/GTH Transceivers, User Guide,UG476 (v1.12.1), retrieved online from <https://www.xilinx.com/support/documentation/user_guides/ug476_7Series_Transceivers.pdf> on Dec. 2019, published on Aug. 14, 2018, 506 pages.

\* cited by examiner

| Latch_D4 (wt: 3) | Latch_D3 (wt: 2) | Latch_D2 (wt: 1) | Latch_D1 (wt: 0) | Skew Comp. Algo. ceil (wt/ 2) | SEL_LINE |
|---|---|---|---|---|---|
| 1 | 1 | 1 | 1 | 0; (Latch_D1) | D1 |
| 1 | 1 | 1 | 0 | 1; (Latch_D2) | D2 |
| 1 | 1 | 0 | 0 | 1; (Latch_D3) | D2 |
| 1 | 0 | 0 | 0 | 2; (Latch_D4) | D3 |

CIRCUIT AND METHOD FOR DYNAMIC CLOCK SKEW COMPENSATION

TECHNICAL FIELD

Various embodiments relate generally to integrated circuits and more specifically, to clock skew compensation.

BACKGROUND

Modern networks are responsible for interconnecting computing devices operable to exchange data. Data may be exchanged from circuit to circuit on a common circuit board or from circuit board to circuit board along a common backplane, for example, in a computer or server. In some implementations, data may be exchanged over long distances, for example, from a travel agent's computer to an airline server on a cloud network.

Data can be transferred in the form of bits and bytes over a digital or analog media. Data transmit and receive systems enable digital or analog communications and its movement between devices. Analog data transfer typically sends data in the form of analog signals, while digital data transfer converts data into digital bitstreams. An analog signal is one which a parameter (e.g., amplitude, phase) that varies smoothly. Video and audio transmissions are often transferred or recorded using analog signals. Digital signals must have a finite set of possible values (e.g., binary on/off).

A phase-locked loop (PLL) is a frequency control circuit that generates an output signal whose phase is related to the phase of an input signal. A frequency oscillator and a phase detector in a feedback loop are often used to form a PLL. Performance parameters about a PLL may include, for example, hold-in range, pull-in range, lock-in range, and loop bandwidth.

SUMMARY

Apparatus and associated methods relate to a dynamic lane-to-lane skew reduction technique having (a) a clocking architecture configured to provide a corresponding first delayed clock signal and a corresponding second delayed clock signal through a first and a second plurality of routing traces, respectively, and (b) a number of skew compensation circuits configured to process the corresponding first delayed clock signal and the corresponding second delayed clock signal to generate a corresponding user clock signal for a corresponding lane of a transmitter. In an illustrative example, a first routing trace may transmit a first delayed clock signal in a direction opposite to a second routing trace transmitting a second delayed clock signal. By implementing the technique, each transmitter lane may receive a corresponding user clock signal having substantially the same delay relative to a reference clock signal such that dynamic lane-to-lane skew may be advantageously reduced.

Various embodiments may achieve one or more advantages. For example, some embodiments may reduce serial lane skews as the lane-to-lane skews among multiple parallel lanes of a transmitter are reduced. In some embodiments, the transmitter may support protocols (e.g., Peripheral Component Interconnect Express (PCIe), high bandwidth memory (HBM)) that have tighter requirements as the serial lane skews are advantageously reduced. In some embodiments, the skew compensation circuit may be configured with selections circuits such that the skew compensation circuit may be compatible with existing architectures of the transmitter. In some embodiments, as the skew reduction technique is achieved based on the actual clocking architecture (e.g., routings), the dynamically calculated delay/skew (e.g., by using the dynamic mechanism to calculate the skew on the fly) may be more accurate such that the lane-to-lane skews may be more accurately compensated. In addition, as the skews no longer need to be balanced during the place and route stage, a faster design cycle of the transmitter may be achieved. Some embodiments may be suitable for reducing the clock skew for multi-lane protocols (e.g., up to 32 lanes for PCIe, and data rate up to 32 Gig for PCIe Gen5). As the bandwidth requirement increases above 400 Gig, number of lanes supported by protocols also increases. Some embodiments may be suitable for reducing the clock skew for physical design of such multilane designs to achieve required serial lane skew limits. Also, the dynamic lane-to-lane skew reduction technique provides a flexible way to reduce the lane-to-lane skew as this technique may be implemented in a digital or analog way based on the design/user requirements.

In one exemplary aspect, an integrated circuit (IC) includes a plurality of N skew compensation circuits configured to receive, through a first plurality of routing traces, an initial reference clock signal, each routing trace of the first plurality of routing traces introduces a corresponding first delay to the initial reference clock signal. The IC also includes a second plurality of routing traces, coupled between an $i^{th}$ skew compensation circuit and an $(i-1)^{th}$ skew compensation circuit, configured to send the corresponding first delayed reference clock signal received by an $i^{th}$ skew compensation circuit to the $(i-1)^{th}$ skew compensation circuit, each routing trace of the second plurality of routing traces introduces a corresponding second delay to the corresponding first delayed reference clock signal, $2 \leq i \leq N$. The $(i-1)^{th}$ skew compensation circuit is further configured to receive the corresponding first delayed reference clock signal and the corresponding second delayed reference clock signal to generate a corresponding user clock signal for a corresponding transmitter lane of a plurality of N parallel transmitter lanes, each transmitter lane of the plurality of N parallel transmitter lanes configured to receive the corresponding user clock signal having substantially the same delay relative to the initial reference clock signal.

In some embodiments, each skew compensation circuit of the plurality of N skew compensation circuits may include (a) a first selection circuit configured to receive a feedback clock signal and the corresponding first delayed reference clock signal to generate a first selected clock signal in response to a first selection signal, (b) a phase detector configured to receive the initial reference clock signal and the first selected clock signal to generate an indication signal, (c) a charge pump circuit configured to receive the indication signal and generate a voltage signal, (d) a low pass filter configured to receive the voltage signal and generate a filtered voltage signal, (e) a voltage controlled delay logic (VCDL) configured to receive the initial reference clock signal and generate the feedback clock signal in response to the filtered voltage signal, and, (f) a second selection circuit configured to receive the feedback clock signal and an output clock signal to generate a second selected clock signal as the corresponding user clock signal in response to a second selection signal.

In some embodiments, the VCDL may include an analog delay line. In some embodiments, the VCDL may include a digital delay line. In some embodiments, the first selection circuit may be configured to output the corresponding first delayed reference clock signal as the first selected clock signal at the start of the operation of the IC. In some embodiments, the second selection circuit may be configured to output the output clock signal as the corresponding user clock signal to bypass the IC. In some embodiments, the phase detector may be configured to compute a phase difference between its two received signals and generate the indication signal to indicate a leading status or a lagging status. In some embodiments, the charge pump circuit may include a capacitor having a capacitance value that is twice its original capacitance value.

In another exemplary aspect, an integrated circuit (IC) includes a plurality of N parallel transmitter lanes, each transmitter lane of the plurality of N parallel transmitter lanes configured to receive a corresponding user clock signal, a plurality of N skew compensation circuits configured to receive, through a first plurality of routing traces, an initial reference clock signal, each routing trace of the first plurality of routing traces introduces a corresponding first delay to the initial reference clock signal, and, a second plurality of routing traces, coupled between an $i^{th}$ skew compensation circuit and an $(i-1)^{th}$ skew compensation circuit, configured to send the corresponding first delayed reference clock signal received by an $i^{th}$ skew compensation circuit to the $(i-1)^{th}$ skew compensation circuit, each routing trace of the second plurality of routing traces introduces a corresponding second delay to the corresponding first delayed reference clock signal, $2 \leq i \leq N$. The $(i-1)^{th}$ skew compensation circuit is further configured to receive the corresponding first delayed reference clock signal and a corresponding second delayed reference clock signal to generate a corresponding user clock, a corresponding user clock signal received by an $(i-1)^{th}$ transmitter lane and a corresponding user clock signal received by an $i^{th}$ transmitter lane are substantially the same user clock signal.

In some embodiments, each skew compensation circuit of the plurality of N skew compensation circuits may include (a) a plurality of N delay buffers connected in series to receive the corresponding first delayed clock signal and generate a plurality of N delayed signals, (b) a plurality of N flip flops, wherein each flip flop of the plurality of N flip flops is clocked by a corresponding delayed signal of the plurality of N delayed signals, (c) a plurality of N latches, each latch of the plurality of N latches configured to receive a corresponding output of a corresponding flip flop of the plurality of N flip flops as a corresponding enable signal, (d) a state machine configured to receive the corresponding output of each latch and generate a selection signal, and, (e) a selection circuit configured to receive the plurality of N delayed signals and output a delay signal in response to the selection signal.

In some embodiments, each buffer of the plurality of N delay buffers may be assigned a corresponding weight. In some embodiments, the state machine may be configured to generate the selection signal in response to a first encountered leading digital 1 among the corresponding outputs of the plurality of N latches. In some embodiments, the state machine may be configured to divide the corresponding weight assigned to the delayed signal which has the first encountered leading digital 1 by a factor of two, generate a ceiling value of the divided weight, and then generate the selection signal in response to a predetermined truth table. In some embodiments, the plurality of N latches may be negatively triggered. In some embodiments, the plurality of N flip flops may be D-type flip flops.

In another exemplary aspect, a method of reducing lane-to-lane clock skew in an integrated circuit (IC) includes (a) routing each compensation circuit of a plurality of N skew compensation circuits to receive, through a first plurality of routing traces, an initial reference clock signal, wherein each routing trace of the first plurality of routing traces introduces a corresponding first delay to the initial reference clock signal, (b) determining a maximum clock propagation delay from clock propagation delays of respective lanes of a transmitter, (c) routing an $i^{th}$ skew compensation circuit with an $(i-1)^{th}$ skew compensation circuit, through a second plurality of routing traces, to send the corresponding first delayed reference clock signal received by the $i^{th}$ skew compensation circuit to the $(i-1)^{th}$ skew compensation circuit, each routing trace of the second plurality of routing traces introduces a corresponding second delay to the corresponding first delayed reference clock signal, $2 \leq i \leq N$, and, (d) forming a corresponding skew compensation circuit of a plurality of N skew compensation circuits to (d1) calculate a skew amount between the corresponding first delayed reference clock signal and the corresponding second delayed reference clock signal for each lane, and (d2) divide the calculated skew amount by a predetermined factor and apply the divided skew amount to the corresponding first delayed reference clock signal to generate a corresponding user clock signal for each corresponding lane of the transmitter.

In some embodiments, forming the corresponding skew compensation circuit may include (e) providing a first selection circuit to receive a feedback clock signal and the corresponding first delayed reference clock signal to generate a first selected clock signal in response to a first selection signal, (f) configuring a phase detector to receive the initial reference clock signal and the first selected clock signal to generate an indication signal, (g) providing a charge pump circuit to receive the indication signal and generate a voltage signal, and, (h) configuring a voltage controlled delay logic (VCDL) to receive the initial reference clock signal and generate the feedback clock signal in response to the voltage signal.

In some embodiments, forming the corresponding skew compensation circuit may also include configuring a second selection circuit to receive the feedback clock signal and an output clock signal to generate a second selected clock signal as the corresponding user clock signal in response to a second selection signal. In some embodiments, forming the corresponding skew compensation circuit may also include configuring the phase detector to compute a phase difference between its two received signals and generate the indication signal to indicate a leading status or a lagging status. In some embodiments, the charge pump circuit may include a capacitor having a capacitance value that is twice its original capacitance value.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Apparatus and associated methods relate to a dynamic lane-to-lane skew reduction technique having (a) a clocking architecture configured to provide a corresponding first delayed clock signal and a corresponding second delayed clock signal through a first and a second plurality of routing traces, respectively, and (b) a number of skew compensation circuits configured to process the corresponding first delayed clock signal and the corresponding second delayed clock signal to generate a corresponding user clock signal for a corresponding lane of a transmitter. In an illustrative example, a first routing trace may transmit a first delayed clock signal in a direction opposite to a second routing trace transmitting a second delayed clock signal. By implementing the technique, each transmitter lane may receive a corresponding user clock signal having substantially the same delay relative to a reference clock signal such that dynamic lane-to-lane skew may be advantageously reduced.

To aid understanding, this document is organized as follows. First, an exemplary platform (e.g., FPGA) suitable to perform data transmission and lane-to-lane skew reduction briefly introduced with reference to FIG. 1. Second, with reference to FIGS. 2A-2F, the discussion turns to the architectures of the lane-to-lane skew reduction technique and methods used to implement and operate the lane-to-lane skew reduction technique. Then, with reference to FIGS. 3A-3C, the discussion discloses an exemplary analog architecture of a skew compensation circuit used in the lane-to-lane skew reduction technique and exemplary timing diagrams of clock signals. Also, with reference to FIGS. 4A-4C, the discussion discloses an exemplary digital architecture of the skew compensation circuit, exemplary timing diagrams of clock signals, and operations to be performed by the digital skew compensation circuit. Finally, with reference to FIG. 5, another exemplary platform (e.g., SOC) that is suitable to perform the data transmission and lane-to-lane skew reduction is further discussed.

Figure 1:
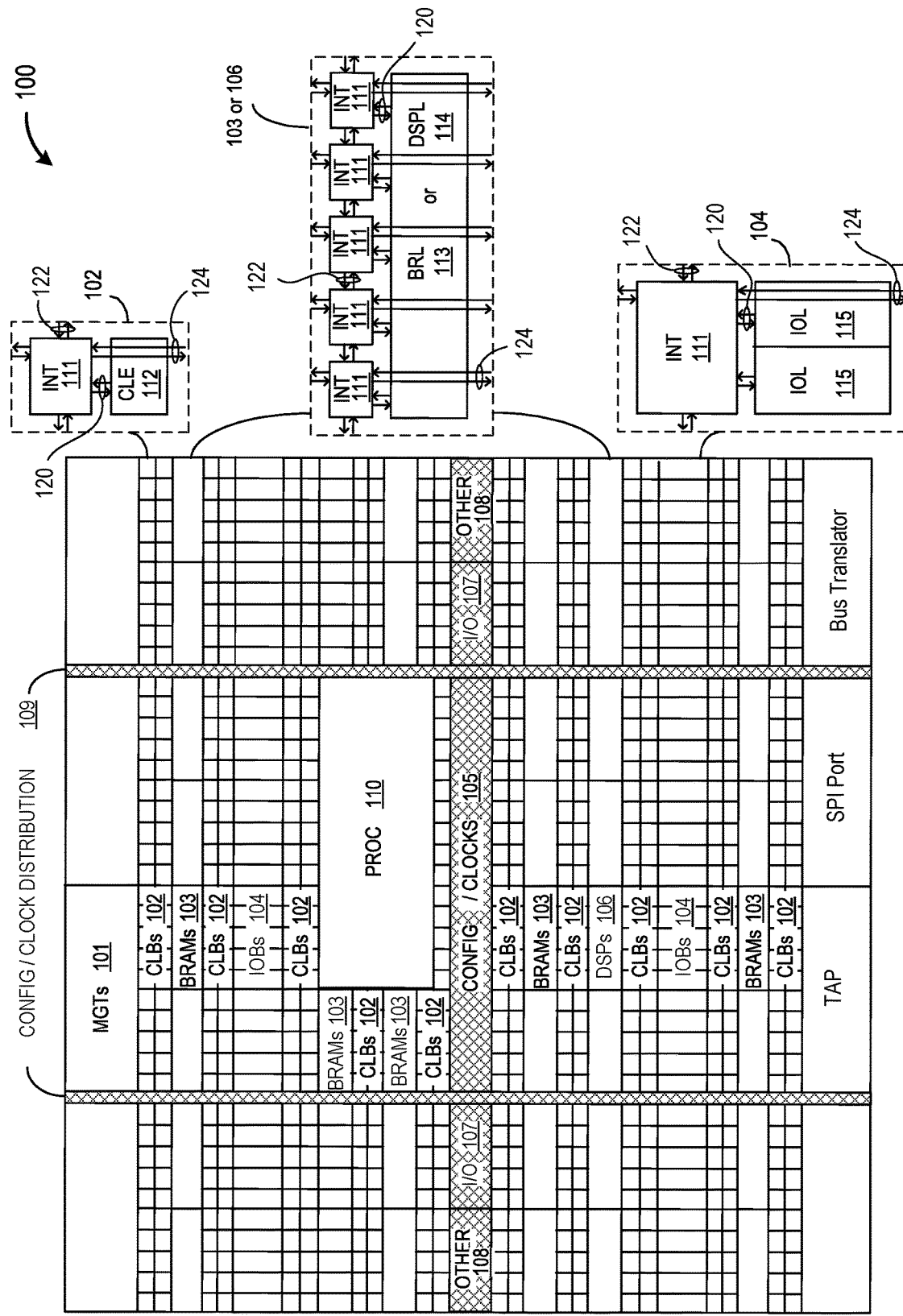
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An 10B 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

Digital systems commonly use clock signals to synchronize data. However, data passing through transmitters of digital systems may become desynchronized because of the transmission serial lane skews, resulting from skew of clock signals across all the lanes. Some applications and processes on an integrated circuit (IC) may share a clock signal driven from one lane. Routing of clock signals may disadvantageously add skew. The interface used by the transmitter or transceiver may also add to the clock signal skew. The various aspects of lane-to-lane skew reduction techniques may be implemented in any block of the programmable IC 100. Any combination of examples may be included in a single IC.

Figure 2A:
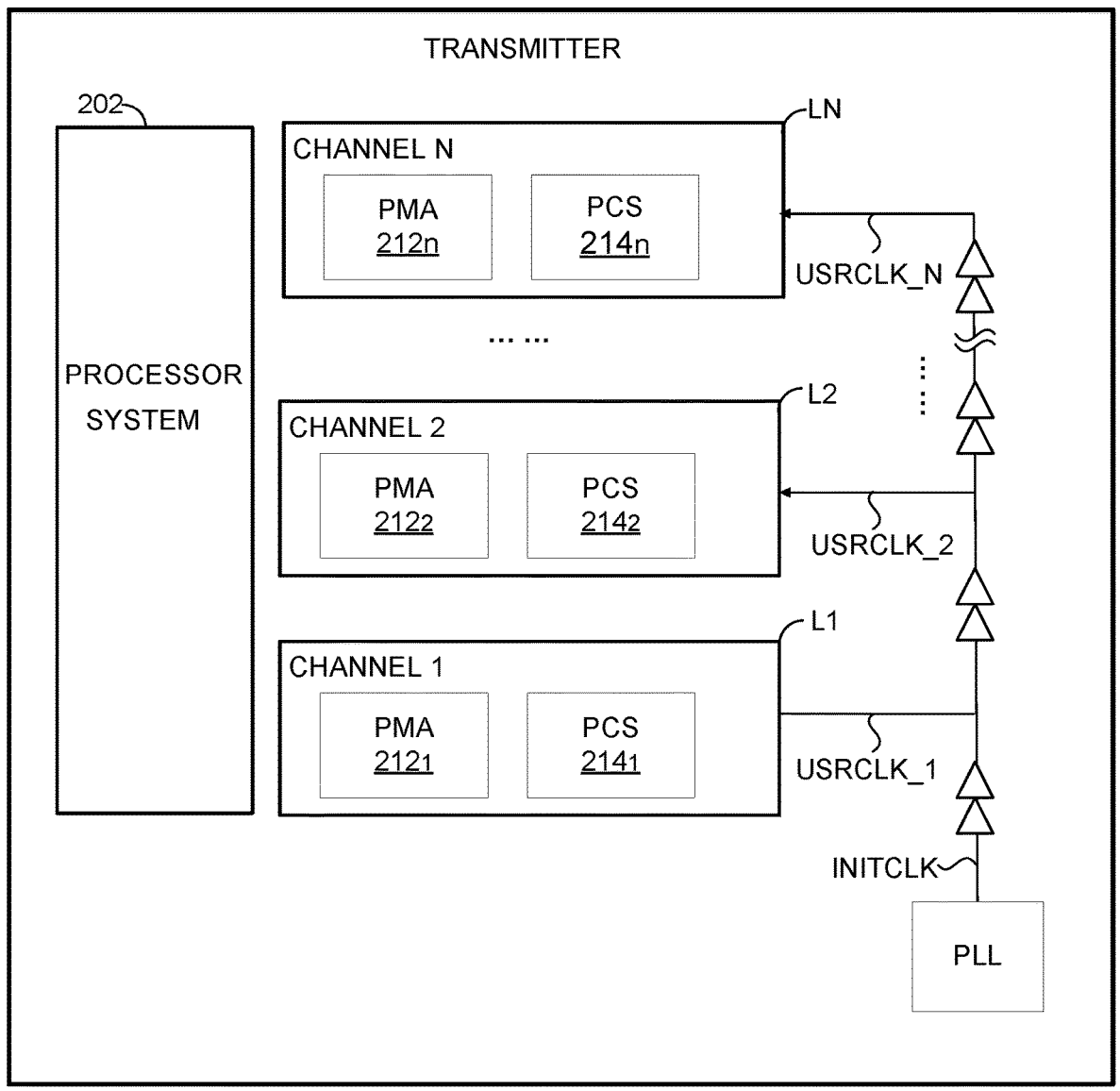
FIG. 2A depicts a block diagram of an exemplary transmitter having multiple lanes.

FIG. 2A depicts a block diagram of an exemplary transmitter having multiple lanes. In this depicted example, a transmitter 200A includes N lanes (or also referred to as channels) for data transmission. N may be any positive integer. Each lane L1-LN includes a physical medium attachment (PMA) (e.g., PMA $212_1$-$212_n$) and a Physical Coding Sub-Layer (PCS) (e.g., PCS $214_1$-$214_n$). The PMA (e.g., PMA $212_1$-$212_n$) may include a serializer (not shown). In some examples, the PMA $212_1$-$212_n$ may convert data from parallel to serial or serial to parallel. The PCS $214_1$-$214_n$ may be configured to implement processing logic between the PMA and the rest of the programmable IC. The transmitter 200A may use multi-lane protocols, such as cache coherent interconnect for accelerators (CCIX), Peripheral Component Interconnect Express (PCIe), and 100G/400G Ethernet. An exemplary transmitter implemented with the lane-to-lane skew reduction technique that uses PCIe is discussed in detail with reference to FIG. 2C. The transmitter 200A can include additional components (e.g., processor system) for transmitting data. The transmitter 200A can implement any number of lanes having PMA and PCS. The transmitter 200A shown in FIG. 2A may be or include a transceiver (e.g., a multi-gigabit transceiver).

The transmitter 200A receives an initial clock signal INICLK (e.g., provided by a phase-locked-loop PLL) and distributes the initial clock signal INICLK to each of its lanes. Because of the natural characteristics of a transmitter 200A, the initial clock signal INICLK may travel different distances before the respective PCS of the lanes L1-LN receive the clock signal. The different distances may result in different time delays (e.g., due to differing resistance-capacitance time constants) between the clock signal received at the lanes. In this depicted example, the corresponding clock signal received by each lane L1-LN is expressed as USERCLK_1, USERCLK_N, respectively. Accordingly, the clock signal as received by each PCS can be skewed from the PCS in other lanes. For example, as shown in FIG. 2A, the PCS $214_1$ for lane L1 may receive the clock signal before the respective PCS for lanes L2, and LN because the clock signal travels further through the transmission medium of the transmitter 200A to reach lanes L2 and LN. In an example, multi-gigabit transceivers (MGTs) with dedicated interface block for the physical layer (PHY) Interface for the PCI Express Architecture (PIPE) may increase the clock skew. In some examples, the clock signal skew can be 1.2 ns between 16 lanes of a multi-gigabit transceiver.

Certain examples described herein apply to components of each lane of the transmitter, and reference to a component of the lane may be made herein generally and can apply to the corresponding component of any lane of the transmitter. For example, reference may be made herein generally to a PMA (e.g., PMA $212_1$-$212_n$), which can apply to any one or more of PMAs. Similarly, reference may be made herein generally to a PCS (e.g., PCS $214_1$-$214_n$), which can apply to any one or more of PCSs.

Figure 2B:
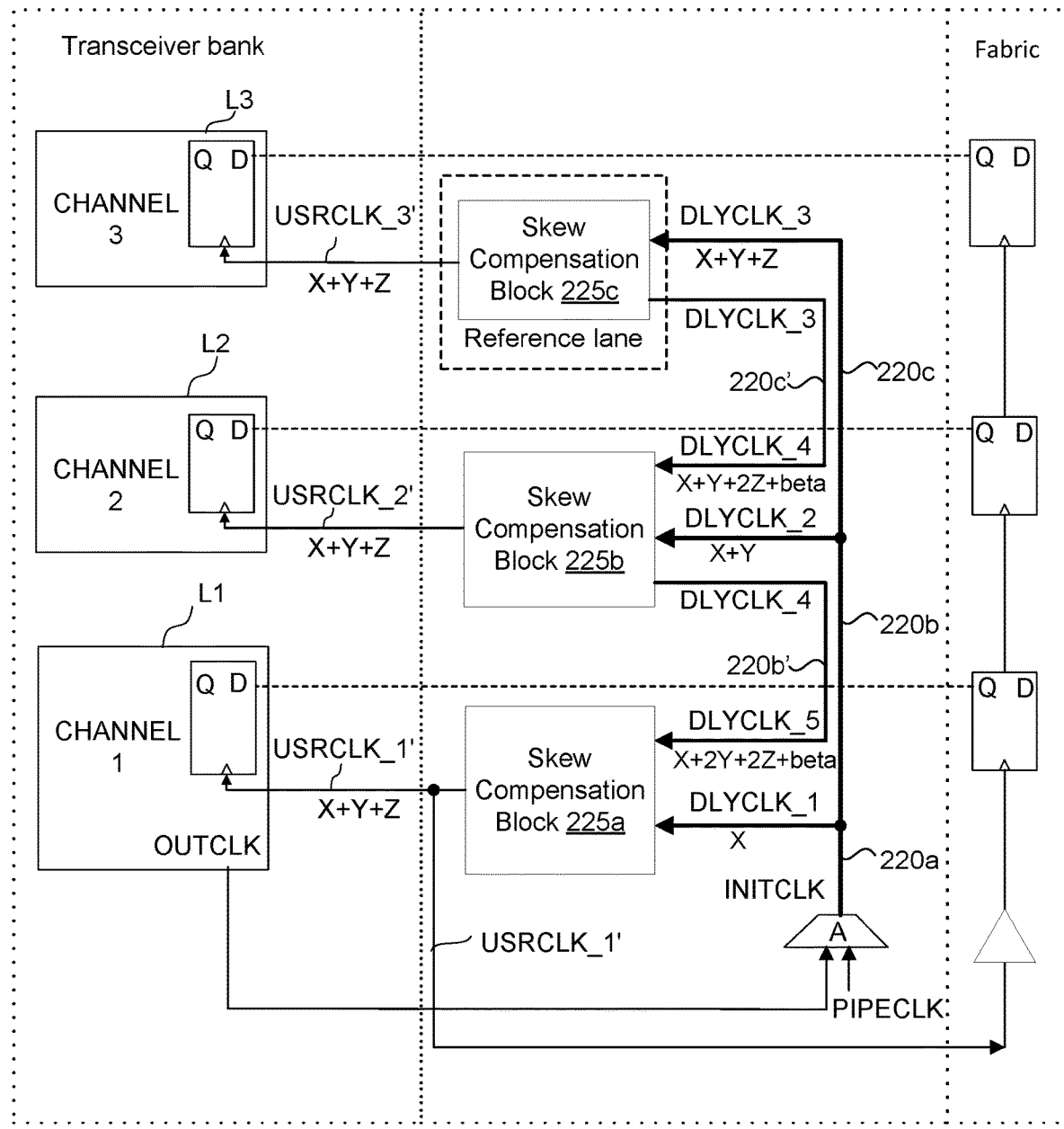
FIG. 2B depicts an exemplary lane-to-lane skew reduction technique implemented in a first embodiment of the transmitter.

FIG. 2B depicts an exemplary lane-to-lane skew reduction technique implemented in a first embodiment of the transmitter. In this depicted example, the transmitter 200B includes three lanes L1, L2, and L3. A first type of routing traces 220a, 220b, and 220c is configured to provide an initial clock signal INITCLK to a corresponding skew compensation circuit 225a, 225b, 225c, respectively. The INITCLK may be selected between an output clock OUTCLK provided by one of the channels (e.g., L1) of the multi-gigabit transceiver and a clock signal PIPECLK provided by a common communication interface (CCI) and PCIe module (CPM) block (in which the clock source for PIPECLK may come from the multi-gigabit transceiver output clock as well). Each routing trace of the first type of routing traces may include a propagation delay. For example, the first routing trace 220a may introduce a first propagation delay X on the initial clock signal INITCLK to generate a first delayed clock signal DLYCLK_1. The second routing trace 220b may introduce a second propagation delay X+Y (e.g., the routing trace difference between the second routing trace 220b and the first routing trace 220a introduces a delay Y) on the initial clock signal INITCLK to generate a second delayed clock signal DLYCLK_2. The third routing trace 220c may introduce a third propagation delay X+Y+Z (e.g., the routing trace difference between the third routing trace 220c and the second routing trace 220b introduces a delay Z) on the initial clock signal INITCLK to generate a third delayed clock signal DLYCLK_3. X, Y and Z may be any numbers. The maximum delay that may be applied to the initial clock signal INITCLK would be X+Y+Z.

To reduce the lane-to-lane skews, three skew compensation circuits 225a, 225b, 225c are configured to generate three clock signals USERCLK_1, USERCLK_2', and USERCLK_3' having the substantially the same propagation delay (e.g., the maximum propagation delay X+Y+Z) to be received by the three lanes such that the lane-to-lane skews may be advantageously reduced. Clock signal routing architectures and skew compensation circuits may be used to generate a corresponding respective propagation delay on the received clock signals (e.g., the clock signals DLYCLK_1, DLYCLK_2, and DLYCLK_3 provided by the first type of the routing traces 220a-220c) to achieve a total propagation delay X+Y+Z on the initial clock signal INITCLK.

More specifically, the transmitter 200B includes a second type of routing traces 220b' and 220c'. The routing trace 220c' connects the third skew compensation circuit 225c to the second skew compensation circuits 225b and provides the third delayed clock signal DLYCLK_3 to the second skew compensation circuits 225b. Accordingly, another delay Z is applied to the clock signal DLYCLK_3. The routing trace 220c and the routing trace 220c' may not be perfectly matched, a parameter is introduced to show the routing delay difference between the routing trace 220c and the routing trace 220c'. The delayed clock signal received by the second skew compensation circuits 225b may be expressed as DLYCLK_4 (e.g., INITCLK+X+Y+2Z+$\beta$). Similarly, the routing trace 220b' connects the second skew compensation circuit 225b to the first skew compensation circuits 225a and provides the fourth delayed clock signal DLYCLK_4 to the first skew compensation circuits 225a. Accordingly, another delay Y is applied to the clock signal DLYCLK_4. The delayed clock signal received by the first skew compensation circuits 225a may be expressed as DLYCLK_5 (e.g., INITCLK+X+2Y+2Z+2$\beta$). In some embodiments, $\beta$ may be considered as a small entity and may be ignored.

Each of the first and second skew compensation circuit 225a-225b receives two corresponding clock signals and calculate a corresponding amount of delay to be applied to one of the two received clock signals (e.g., DLYCLK_2) to generate the user clock signal (e.g., USERCLK_2'). For example, the second skew compensation circuit 225b receives the clock signal DLYCLK_2 and the clock signal DLYCLK_4. Based on the two received clock signals, the skew compensation circuit 225b may calculate a corresponding amount of delay (e.g., Z) to be applied to the DLYCLK_2 to generate the user clock signal USERCLK_2'. Thus, the user clock signal USERCLK_2' may have a total delay X+Y+Z compared to the initial clock signal INITCLK. Accordingly, the skew between the third lane L3 and second lane L2 may advantageously be reduced or substantially eliminated. Similarly, the first skew compensation circuit 225a may calculated a corresponding amount of delay (e.g., Y+Z) to be applied to the DLYCLK_1 to generate the user clock signal USERCLK_1. Thus, the user clock signal USERCLK_1' may have a total delay X+Y+Z compared to the initial clock signal INITCLK. Accordingly, the skew between the second lane L2 and first lane L1 may advantageously be reduced or substantially eliminated.

As the clock signal DLYCLK_3 (and the USERCLK_3') is selected as a reference clock signal, the third skew compensation circuit 225c may be configured to operate in bypass mode (e.g., no operations would be performed by the third skew compensation circuit 225c). Exemplary architectures of the skew compensation circuit will be discussed in detail with reference to FIGS. 3A-3E and FIGS. 4A-4D.

Figure 2C:
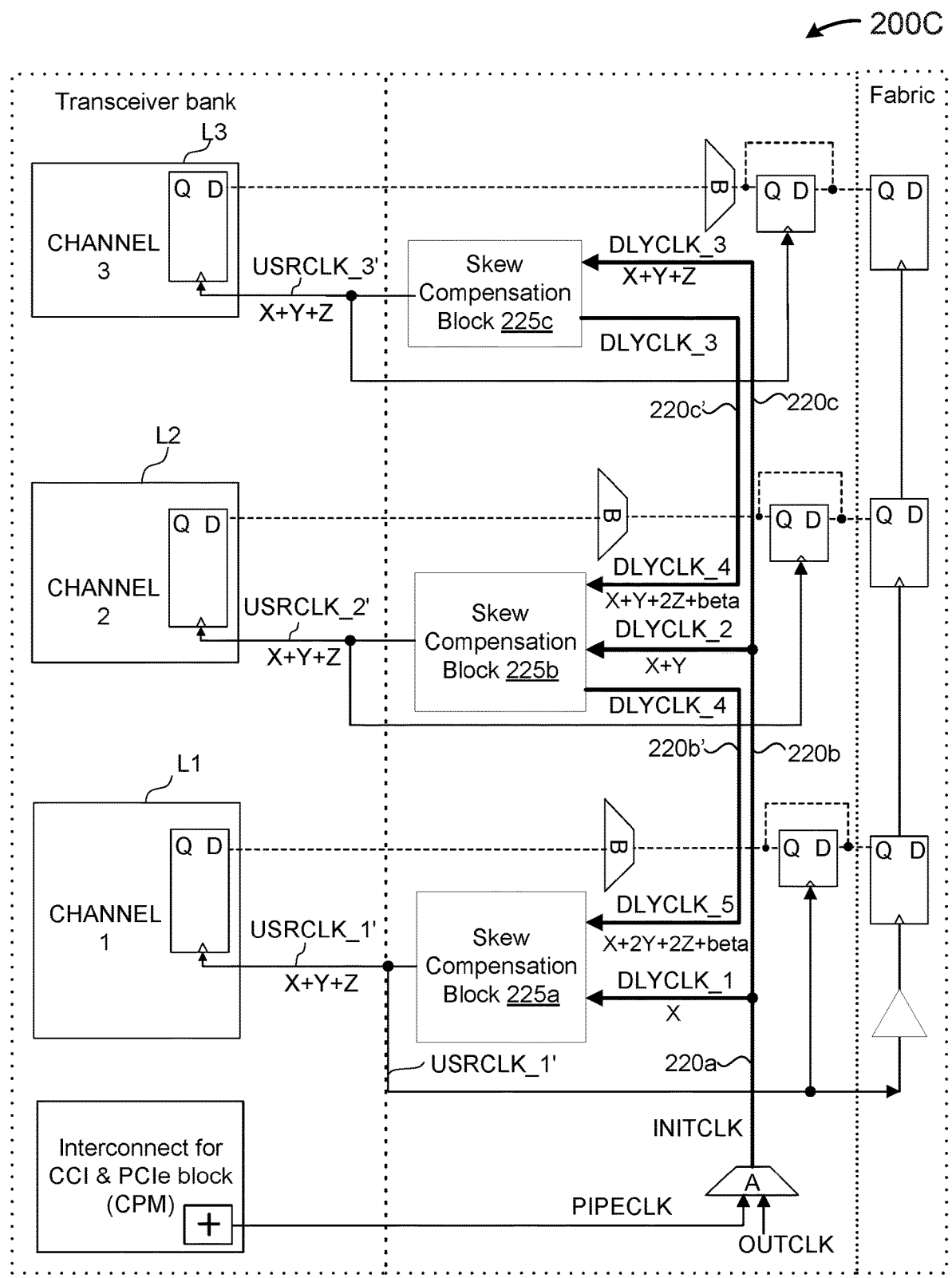
FIG. 2C depicts an exemplary lane-to-lane skew reduction technique implemented in a second embodiment of the transmitter.

FIG. 2C depicts an exemplary lane-to-lane skew reduction technique implemented in a second embodiment of the transmitter. In this depicted example, the transmitter 200C also includes an interconnect for common communication interface (CCI) and PCIe module (CPM). The CPM may be configured to provide the initial clock signal INITCLK. The clock routing architecture (e.g., the first type of routing traces and the second type of routing traces) and the skew compensation circuits may be used to reduce lane-to-lane skew as discussed with reference to FIG. 2C. By reducing the lane-to-lane skew, the serial lane skews may be reduced accordingly such that the transmitter may be able to support protocols (e.g., PCIe, high bandwidth memory (HBM)) having higher requirements.

Figure 2D:
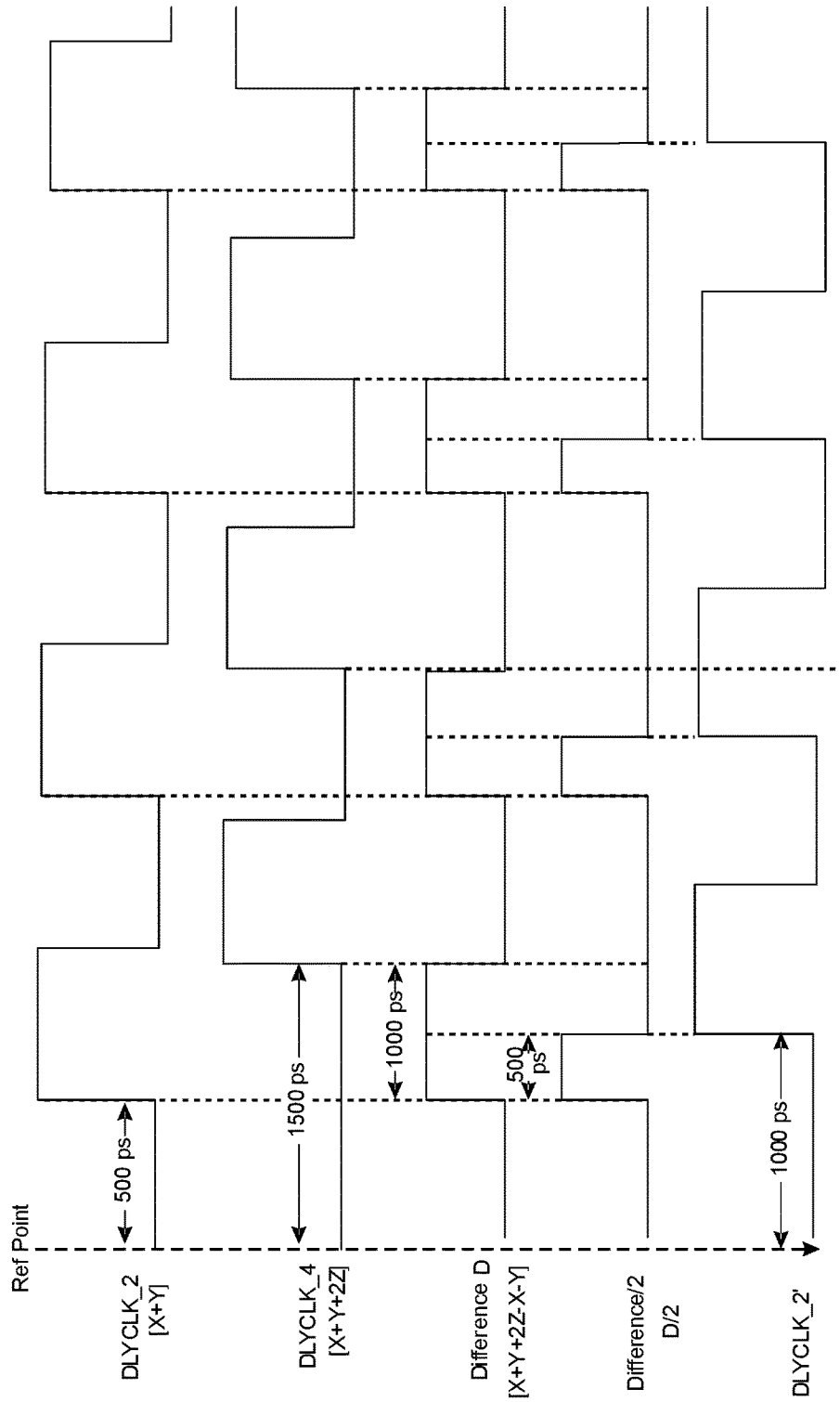
FIG. 2D depicts timing diagrams of clock signals used in the transmitter.

FIG. 2D depicts timing diagrams of clock signals used in the transmitter. In this depicted example, timing diagrams of clock signals used in FIG. 2B and FIG. 2C are shown. X is assumed to be 200 ps, Y is assumed to be 300 ps, Z is assumed to be 500 ps, $\beta$ is assumed to be 50 ps (e.g., is ignored for simplicity). As discussed with reference to FIG. 2B, the second skew compensation circuit 225b receives the clock signal DLYCLK_2 (delayed by X+Y) and DLYCLK_4 (delayed by X+Y+2Z). The second skew compensation circuit 225b then compares the two clock signals (e.g., DLYCLK_2 and DLYCLK_4) and generate a phase difference D. The generate phase difference D is then divided by a factor of 2 and applied to the clock signal DLYCLK_2. Thus, the clock signal USERCLK_2' that has a delay of X+Y+Z (compared to the initial clock signal INITCLK) may be obtained. As all the clock signals received by different lanes have substantially the same delay (e.g., X+Y+Z), lane-to-lane skew may be advantageously reduced or eliminated.

Figure 2E:
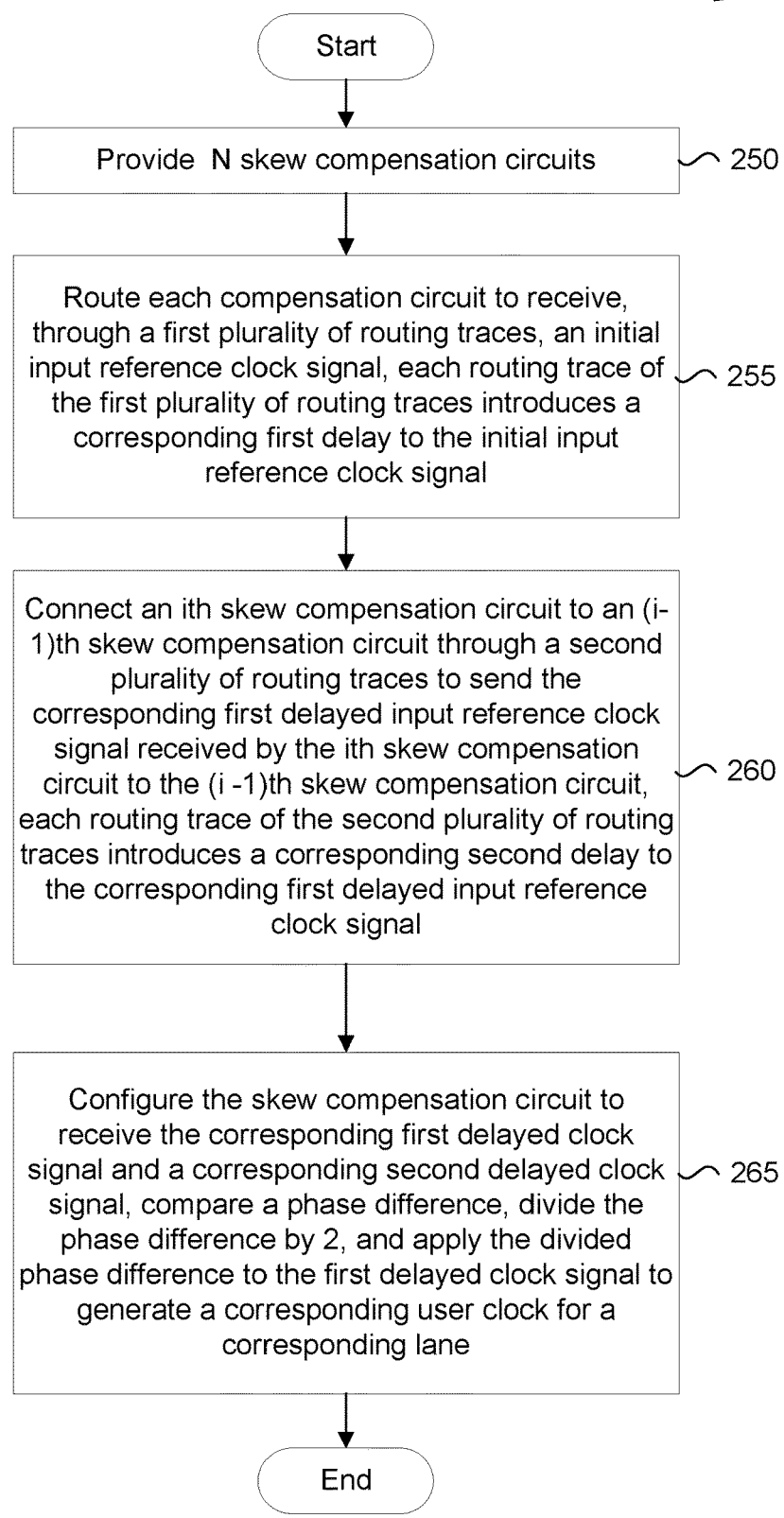
FIG. 2E depicts a flow chart of an exemplary method to implement the lane-to-lane skew reduction technique.

FIG. 2E depicts a flow chart of an exemplary method to implement the lane-to-lane skew reduction technique. An exemplary method 200E to implement the lane-to-lane skew reduction technique includes, at 250, providing N skew compensation circuits (e.g., 225a-225c). The method 200E also includes, routing each compensation circuit to receive, through a first plurality of routing traces (e.g., 220a-220c), an initial reference clock signal (e.g., INITCLK). Each routing trace of the first plurality of routing traces introduces a corresponding first delay (e.g., X, X+Y, X+Y+Z) to the initial reference clock signal to form a corresponding first delayed clock signal (e.g., DLYCLK_1, DLYCLK_2, DLYCLK_3).

The method 200E also includes, at 260, connecting an $i^{th}$ skew compensation circuit (e.g., the third skew compensation circuit 225c) to an $(i-1)^{th}$ skew compensation circuit (e.g., the second skew compensation circuit 225b), through a second plurality of routing traces, (e.g., routing trace 220c'), to send the corresponding first delayed clock signal (e.g., DLYCLK_3) received by the $i^{th}$ skew compensation circuit (e.g., the third skew compensation circuit 225c) to the $(i-1)^{th}$ skew compensation circuit (e.g., the second skew compensation circuit 225b). Each routing trace (e.g., routing trace 220c') of the second plurality of routing traces (e.g., routing traces 220b', 220c') introduces a corresponding second delay (e.g., Z, Y) to the corresponding first delayed clock signal to form a corresponding second delayed clock signal (e.g., DLYCLK_4, DLYCLK_5).

The method 200E also includes, at 265, configuring the corresponding skew compensation circuit (e.g., the second skew compensation circuit 225b) to receive the corresponding first delayed clock signal (e.g., DLYCLK_2) and the corresponding second delayed clock signal (e.g., DLYCLK_4), compare a phase difference between the two received clock signals, divide the phase difference by a factor of two, and apply the divided phase difference to the first delayed clock signal to generate a corresponding clock signal (e.g., USERCLK_2) for a corresponding lane. By providing the second routing traces, each skew compensation circuit may calculate a corresponding skew amount to be applied to its first received clock signal to generate the corresponding clock signal for the corresponding lane. As all the clock signals received by different lanes have substantially the same delay (e.g., X+Y+Z), lane-to-lane skew may be advantageously reduced or eliminated.

Figure 2F:
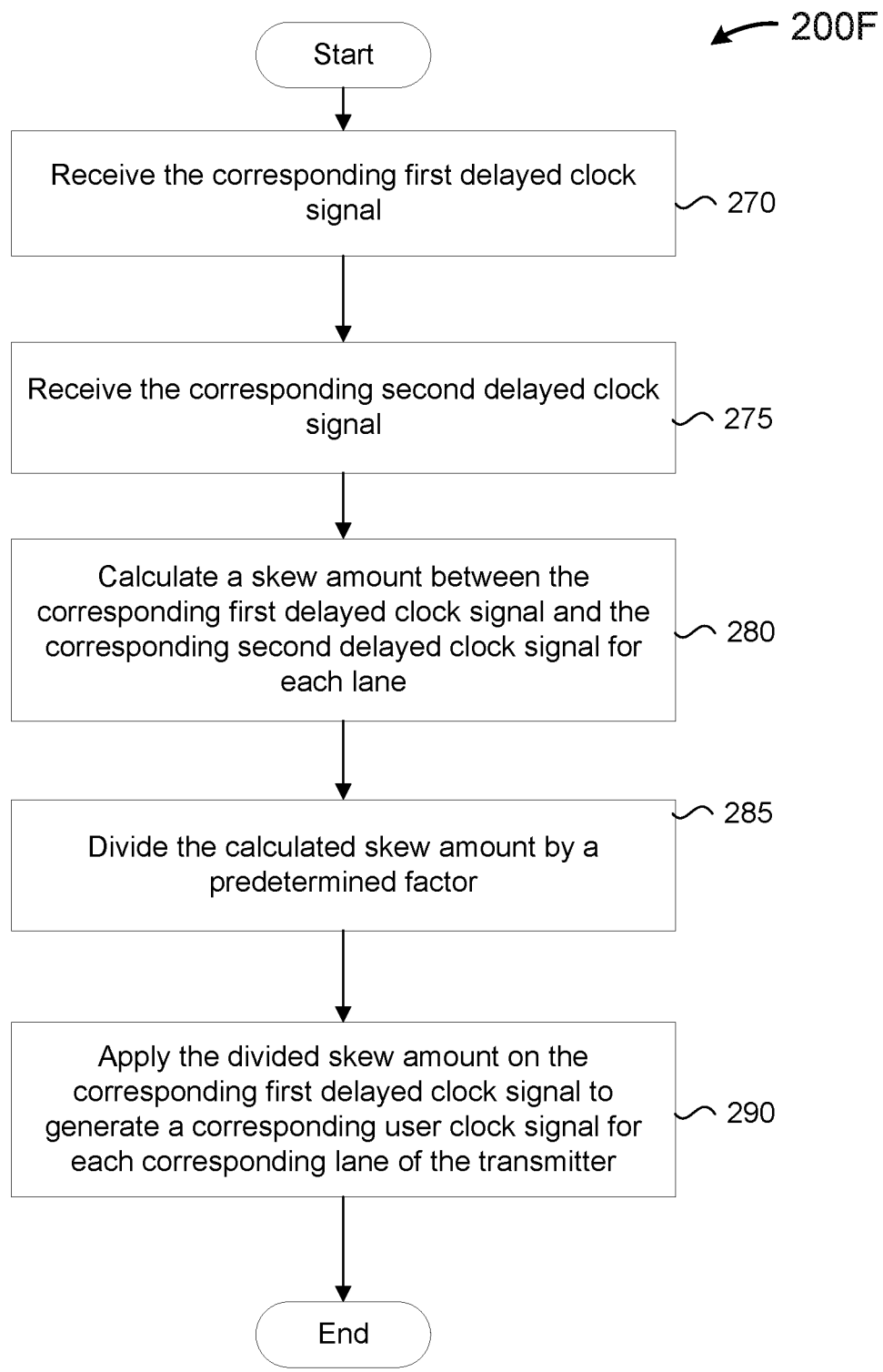
FIG. 2F depicts a flow chart of an exemplary method to reduce the lane-to-lane skew through the first exemplary skew compensation circuit.

FIG. 2F depicts a flow chart of an exemplary method to reduce the lane-to-lane skew based on the lane-to-lane skew reduction technique. An exemplary method 200F to reduce the lane-to-lane skew includes, at 270, receiving the corresponding first delayed clock signal and, at 275, receiving the corresponding second delayed clock signal. The method 200F also includes, at 280, calculating a skew amount (e.g., phase difference D) between the corresponding first delayed clock signal and the corresponding second delayed clock signal for each lane. The method 200F also includes, at 285, dividing the calculated skew amount by a predetermined factor (e.g., a factor of two) and, at 290, applying the divided skew amount (e.g., D/2) to the corresponding first delayed clock signal to generate a corresponding user clock signal for each corresponding lane of the transmitter. Thus, each user clock signal to be received by each corresponding lane is delayed by substantially the same amount of delay. Accordingly, lane-to-lane skew may be advantageously reduced.

Figure 3A:
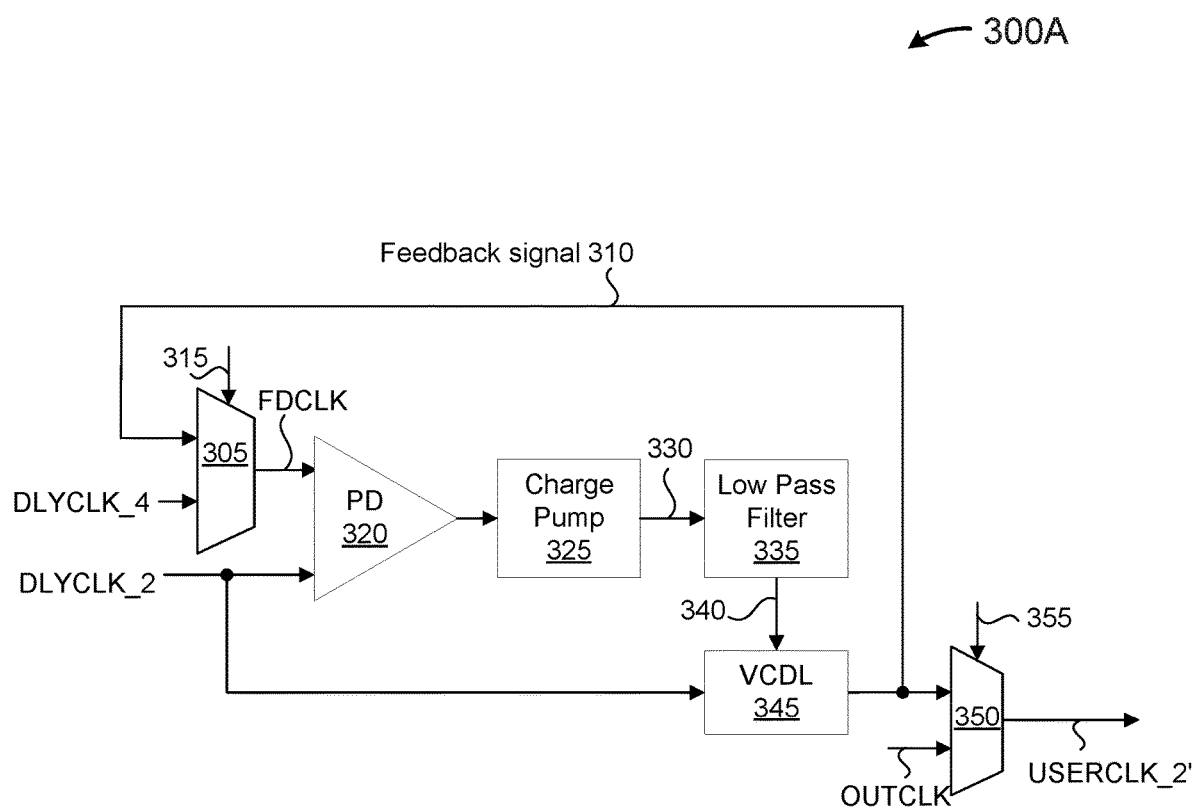
FIG. 3A depicts a block diagram of a first exemplary skew compensation circuit implemented in the lane-to-lane skew reduction technique.

FIG. 3A depicts a block diagram of a first exemplary skew compensation circuit implemented in the lane-to-lane skew reduction technique. An analog architecture of the skew compensation circuit is discussed. In this depicted example, the skew compensation circuit 300A (e.g., the skew compensation circuit 225a-225c) includes a first selection circuit 305 configured to receive the second delayed clock signal (e.g., DLYCLK_4) and a feedback signal 310. A first selection signal 315 may be configured to select between the second delayed clock signal DLYCLK_4 and the feedback signal 310. At the start of the operation, the second delayed clock signal DLYCLK_4 may be selected. In this depicted example, the first selection signal 315 enables the first selection circuit 305 to output the feedback signal 310.

The skew compensation circuit 300A also includes a phase detector 320 configured to receive the selected signal (e.g., the feedback signal 310) and the corresponding first delayed clock signal (e.g., DLYCLK_2) and compare a phase difference between these two clock signals. In some embodiments, the phase detector 320 may generate a pair of direction signals UP and DN (down) depending on the phase difference between the received feedback signal 310 and the clock signal DLYCLK_2.

The phase difference (e.g., the pair of direction signals) is then received by a charge pump circuit 325. The charge pump circuit 325 transforms the phase difference into a control voltage signal 330 whose value at a given instant in time depends on the inputs received from the phase detector 320. The skew compensation circuit 300A also includes low pass filter 335 configured to receive the voltage signal 330 and generate a filtered voltage signal 340.

The skew compensation circuit 300A also includes a voltage-controlled delay logic (VCDL) 345 configured to receive the corresponding first delayed clock signal (e.g., the DLYCLK_2) and introduce a delay on the first delayed clock signal (e.g., the DLYCLK_2) in response to the filtered voltage signal 340 to generate the feedback signal 310. Thus, the corresponding clock signal (e.g., USERCLK_2') for the corresponding lane is generated. Accordingly, lane-to-lane skew may be advantageously reduced. In some embodiments, the skew compensation circuit 300A may also include a second selection circuit 350 configured to receive the corresponding user clock signal (e.g., USERCLK_2') and an output clock signal (OUTCLK) generated such that a second selection signal 355 may select between USERCLK_2' and OUTCLK to bypass the skew compensation circuit 300A for backward compatibility to an existing architecture.

Due to the clocking architecture proposed with reference to FIGS. 2B-2C, the clock skew (e.g., the phase difference D) between the first delayed clock signal and the second delayed clock signals is twice its value. A value of a capacitor in the charge pump circuit 325 may be calibrated twice (e.g., 2C) its original calibrated value (e.g., C) such that a skew amount D/2 may be obtained. Exemplary architectures of the phase detector, charge pump circuit, and the VCDL are discussed in further detail with reference to FIGS. 3B-3E.

Figure 3B:
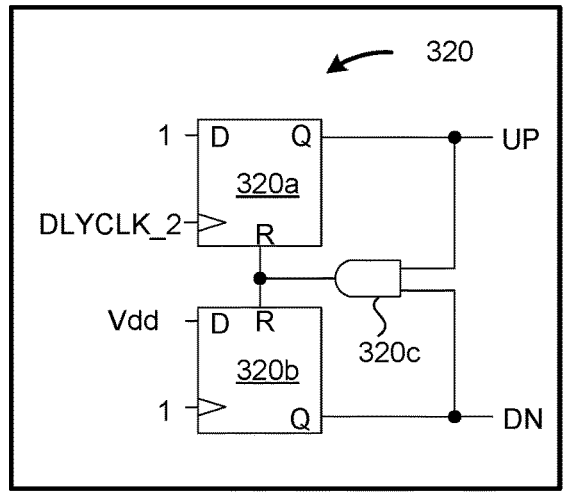
FIGS. 3B-3E depicts exemplary circuit blocks used to form the first exemplary skew compensation circuit.

FIGS. 3B-3E depicts exemplary circuit blocks used to form the first exemplary skew compensation circuit and exemplary timing diagrams of phase detector output signals. FIG. 3B depicts an architecture of an exemplary phase detector implemented in the skew compensation circuit. The phase detector 320 includes a first flip-flop 320a, a second flip-flop 320b, and an AND gate 320c. In this depicted example, the first flip-flop 320a and second flip-flop 320b are D flip-flop. The corresponding first delayed clock signal (e.g., DLYCLK_2) and the corresponding second delayed clock signal (e.g., DLYCLK_4) received by the corresponding skew compensation circuit (e.g., skew compensation circuit 225b) are provided to the phase detector 320 as input with the clock signal of the first flip-flop 320a and the second flip-flop 320b D flip-flop, respectively. The phase detector 320 gives the output signal UP and DN which is phase error signal whenever the reset pulse is high.

Figure 3C:
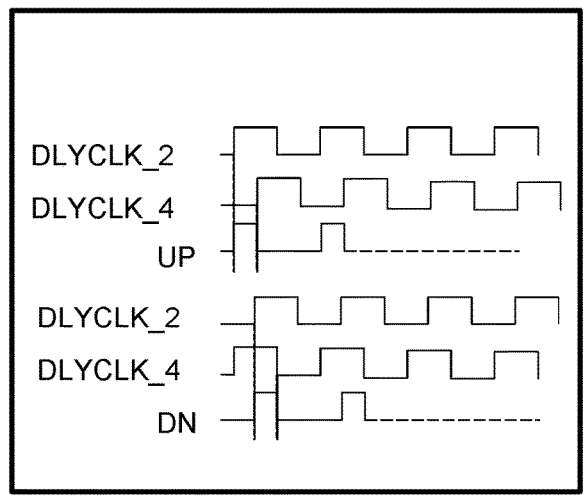

FIG. 3C depicts exemplary timing diagrams of the corresponding first delayed clock signal (e.g., DLYCLK_2), the corresponding second delayed clock signal (e.g., DLYCLK_4), and the output signals UP and DN. The output signals UP and DN may indicate a leading or lagging status between the phase relationship of the corresponding first delayed clock signal (e.g., DLYCLK_2) and the corresponding second delayed clock signal (e.g., DLYCLK_4). For example, when DLYCLK_2 is leading than DLYCLK_4, the output signal UP indicates a digital 1, and when DLYCLK_2 is lagging than DLYCLK_4, the output signal DN indicates a digital 1.

Figure 3D:
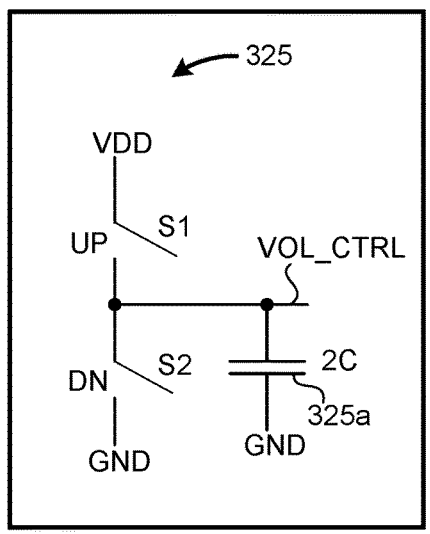

FIG. 3D depicts an architecture of an exemplary charge pump circuit implemented in the skew compensation circuit. The charge pump circuit 325 includes a first switch S1, a second switch S2, and a capacitor 325a. The first switch S1 is controlled by the output signal UP, and the second switch S2 is controlled by the output signal DN. When the first switch S1 is triggered by the pulse UP, the capacitor 325a may be charged and likewise, if the second switch S2 is triggered by the pulse DN, the capacitor 325a may be discharged. By using the charge pump circuit 325, the clock skew is converted from time domain into voltage domain. The relationship between the time domain and the voltage domain may be expressed as:

$$d(v) = \frac{2d(t) * I}{2c}$$

wherein, d(v) is the voltage resolution under locked condition, I is the current across the charge pump circuit, c is the capacitance value of the capacitor 325a, d(t) is the pulse width of the output of the phase detector. As discussed with reference to FIG. 2B and FIG. 3A, the clock skew registered (e.g., D) is twice as the skew to be applied to the corresponding first delayed clock signal, the capacitance value of the capacitor 325a may be changed to twice (2C) its original calibrated value (C) to obtain the needed skew (e.g., D/2).

Figure 3E:
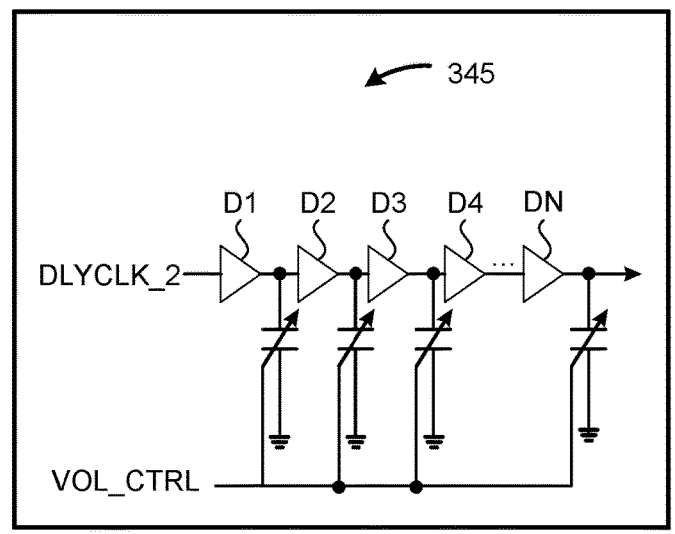

FIG. 3E depicts an architecture of an exemplary VCDL implemented in the skew compensation circuit. In this depicted example, the VCDL 345 includes a number of delay buffers connected in series to receive the corresponding first delayed clock signal (e.g., DLYCLK_2). The VCDL 345 also includes a number of capacitors. Each capacitor is coupled to an output of a corresponding delay buffer. The controlled voltage signal generated by the charge pump circuit 325 and filtered by the low pass filter 335 is applied to the number of capacitors to enable the VCDL 345 to generate the feedback signal 310. In some embodiments, the VCDL 345 may be an analog VCDL. In some embodiments, the VCDL 345 may be a digital circuit. In some embodiments, the VCDL 345 may have a hybrid architecture.

Figure 3F:
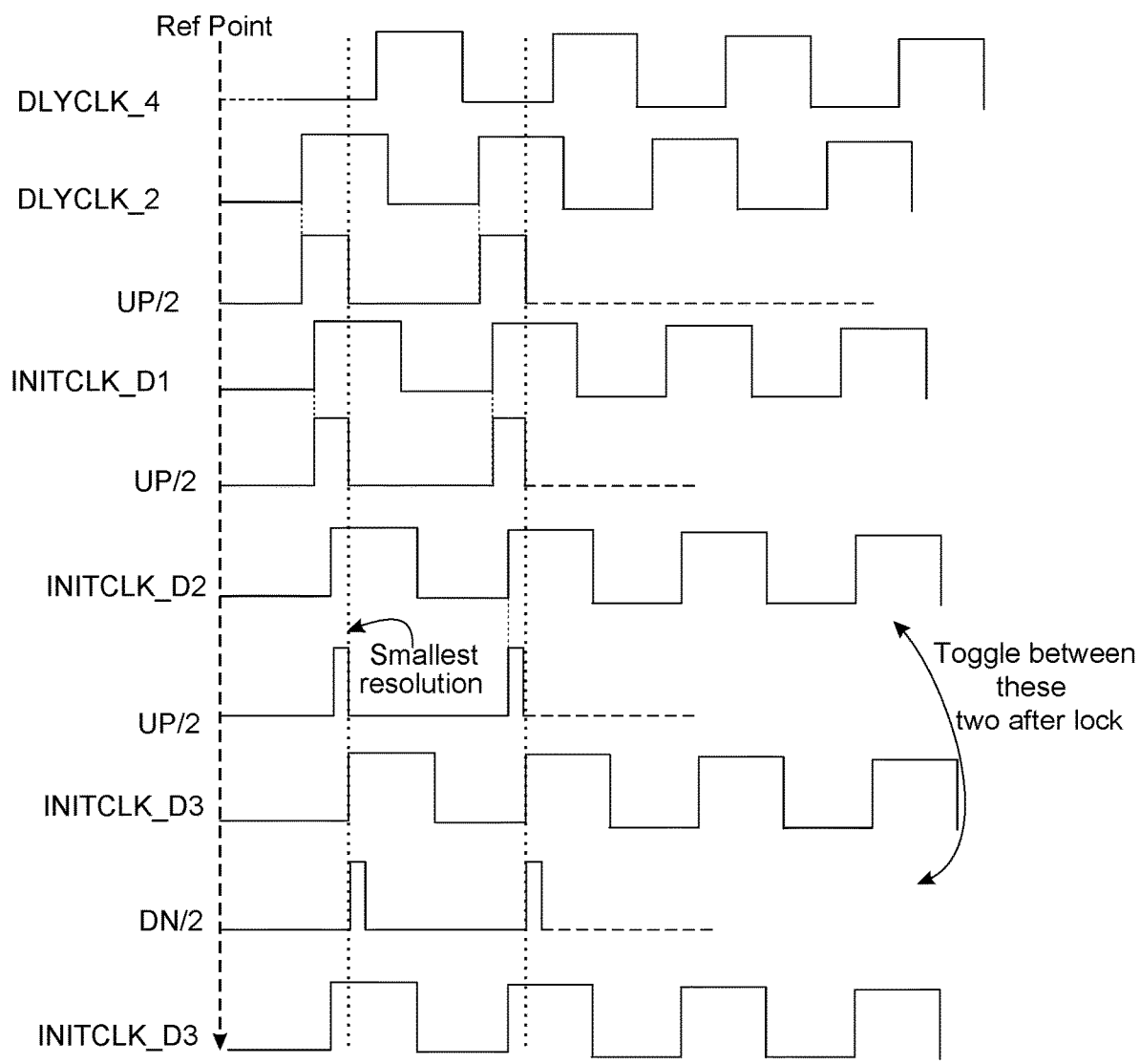
FIG. 3F depicts timing diagrams of clock signals related to the first exemplary skew compensation circuit.

FIG. 3F depicts timing diagrams of clock signals related to the first exemplary skew compensation circuit. At the start of the operation of the skew compensation circuit (e.g., the skew compensation circuit 225b), the second delayed clock signal DLYCLK_4 is routed to FDCLK through the first selection circuit 305 as shown in FIG. 3A. The phase detector 320 compares the initial phase difference between the first delayed clock signal DLYCLK_2 and the second delayed clock signal DLYCLK_4 and produces a pulse UP. The width of the pulse UP (e.g., 2Z) is twice the actual skew difference of the first delayed clock signal DLYCLK_2 (e.g., has a delay of X+Y) with respect to the reference channel (e.g., channel 3 has a delay of X+Y+Z) as discussed with reference to FIG. 2B. For simplify, the division of the voltage by two is shown in the time domain as UP/2. UP/2 is the half width of the pulse UP.

The pulse Up triggers the charge pump circuit 325 and the corresponding voltage is registered across the capacitor 325a. Since the capacitance value is chosen to be twice its original calibrated value, the voltage (e.g., the controlled voltage signal 330) generated by the charge pump circuit 325 would be half based on the above equation. The controlled voltage signal 330 may be then passed through the low pass filter 335 to filter high frequency jitters, for example. The filtered voltage signal 340 is used to control the VCDL 345 which generates an INITCLK_D1 waveform (e.g., feedback signal 310). The feedback loop is a negative feedback loop. The next pulse UP/2 is generated, based on the INITCLK_D1 waveform and the second delayed clock signal DLYCLK_4, by the phase detector 320 and then converted into a voltage to control the VCDL to generate INITCLK_D2. This continues till UP/2 reaches its minimum resolution and a lock condition is achieved. In this depicted example, at this point, INITCLK_D3 may toggle between two positions under the influence of UP/2 and DN/2. After lock condition is achieved, INITCLK_D3 is chosen as the corresponding output to be received by the corresponding lane.

Figure 4A:
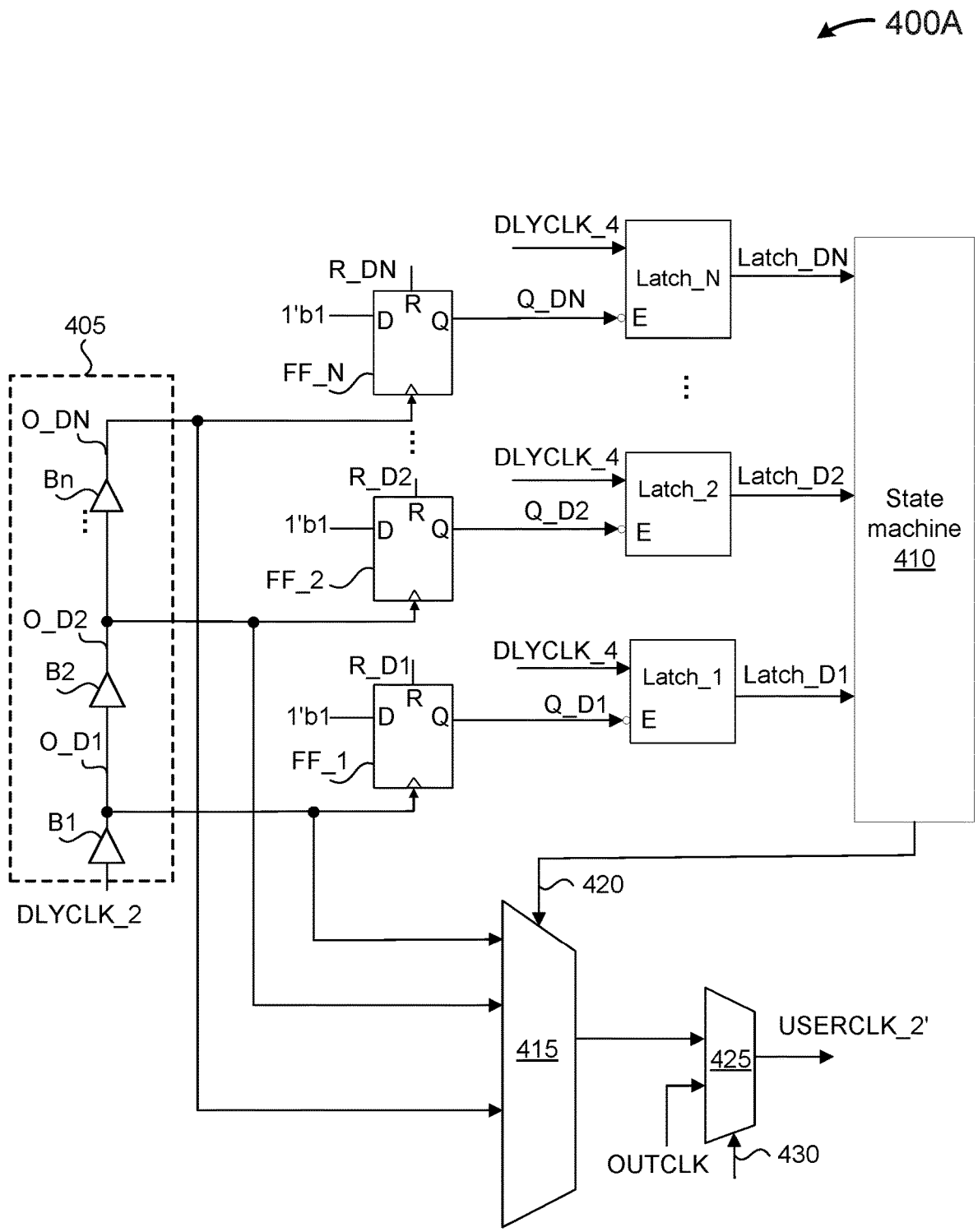
FIG. 4A depicts a block diagram of a second exemplary skew compensation circuit implemented in the lane-to-lane skew reduction technique.

FIG. 4A depicts a block diagram of a second exemplary skew compensation circuit implemented in the lane-to-lane skew reduction technique. A digital architecture of the skew compensation circuit is discussed. In this depicted example, the skew compensation circuit 400A (e.g., the skew compensation circuit 225a-225c) includes a delay circuit 405 having a number of delay buffers (e.g., B1-Bn) connected in series to receive the corresponding first delayed clock signal (e.g., DLYCLK_2). Each buffer in the delay circuit 405 is assigned a fixed continuous integer value (e.g., weight).

Each buffer's output (e.g., O_D1, O_DN) is used as the clock signal for a corresponding flip flop of a number of flip flips (e.g., FF_1, FF_N), respectively. In this depicted example, the flip flops are D-type flip flops. The input of each D-type flip flops receives a reference value (e.g., digital 1). Each flip flop may be reset by a corresponding reset signal (e.g., R_D1, . . . , R_DN). After triggered by the corresponding clock signal (e.g., O_D1, O_DN) and reset by the corresponding reset signal, each of the D-type flip flops may generate a corresponding response (e.g., Q_D1, . . . Q_DN). Each of the responses may then be used as an enable signal for a corresponding latch of a number of latches (e.g., Latch_1, Latch_N) which has the corresponding second delayed clock signal (e.g., DLYCLK_4) as its data input. The output of each latch (e.g., Latch_1, Latch_N) is shown as Latch_1, Latch_N.

The buffers' outputs (e.g., O_D1, O_DN) are also received by a selection circuit 415. The selection circuit 415 is configured to output a selected buffer's output (e.g., delay) in response to a selection signal 420. The selection signal 420 is generated by a state machine 410. More specifically, the state machine 410 is configured to sample the output of the latches. In some embodiments, the state machine is also configured to find the first encountered one in from the outputs of the latches after the expiry of a counter (not shown) and generate a selection signal 415 accordingly. In some embodiments, the detection of the first encountered one may be achieved by a leading one detector. The counter is used to ensure all the latches have a valid output. The corresponding buffer's output (e.g., O_D1, O_DN) would be the equivalent phase difference between the corresponding first delayed clock signal (e.g., DLYCLK_2) and the corresponding second delayed clock signal (e.g., DLYCLK_4). The corresponding fixed integer value assigned to that delay buffer is considered and divided by two to find the net skew correction to the corresponding first delayed clock signal for that lane. Exemplary operations to be formed by the state machine is discussed in further detail with reference to FIG. 4C.

In some embodiments, the skew compensation circuit 400A may also include a second selection circuit 425 configured to receive the corresponding user clock signal (e.g., USERCLK_2') and an output clock signal (OUTCLK) generated by, for example, the first lane LN1 such that a second selection signal 430 may select between USERCLK_2' and OUTCLK to bypass the skew compensation circuit 400A for backward compatibility to an existing architecture.

Figure 4B:
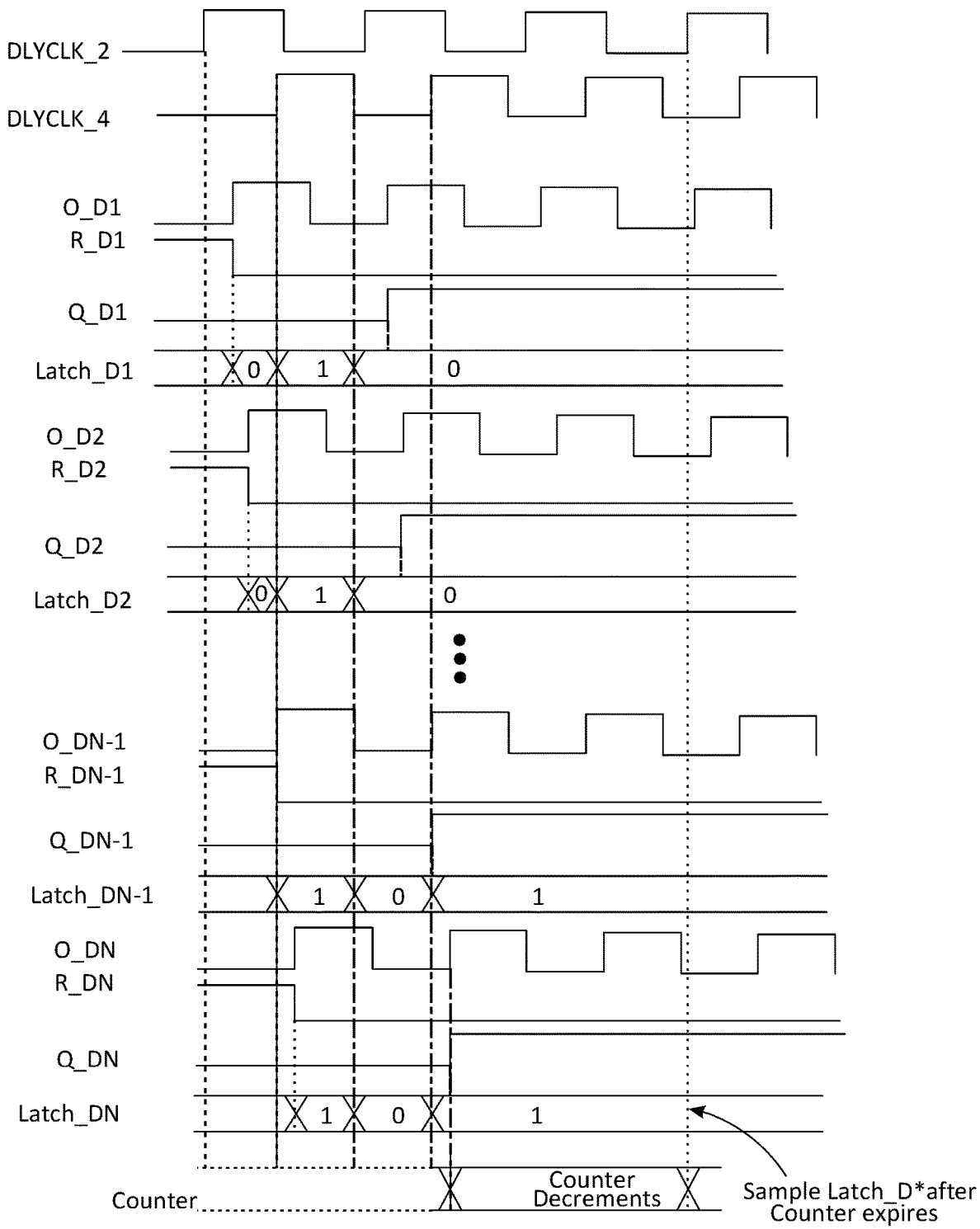
FIG. 4B depicts timing diagrams of clock signals related to the second exemplary skew compensation circuit.

FIG. 4B depicts timing diagrams of clock signals related to the second exemplary skew compensation circuit. In this depicted example, exemplary reset signals, and clock signals generated by the D-type flip flops and the latches are shown. In this depicted example, the signal Latch_DN-1 has the first encountered one after the expiry of the counter.

Figures 4C, 4D:
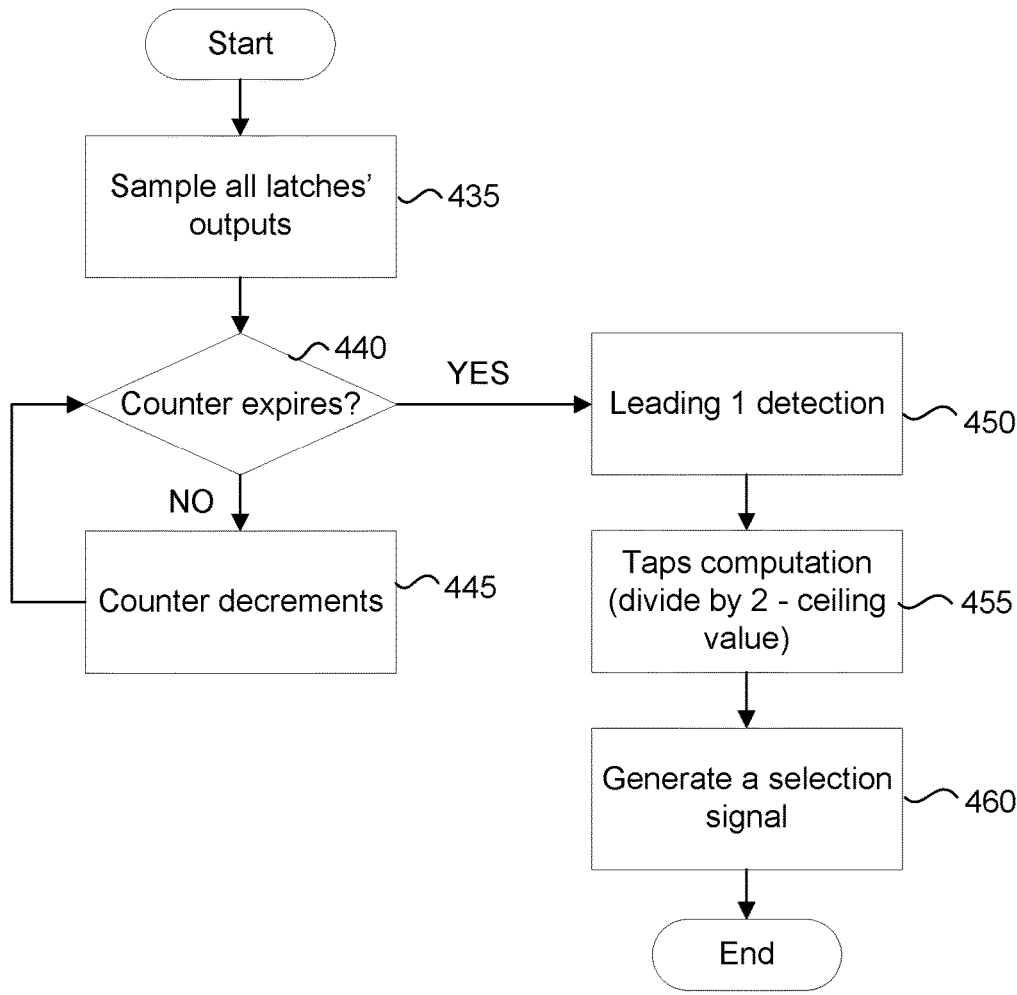
FIG. 4C depicts a flow chart of exemplary operations to be performed by a state machine
FIG. 4D depicts an exemplary truth table used by the state machine in the second exemplary skew compensation circuit.

FIG. 4C depicts a flow chart of exemplary operations to be performed by a state machine. FIG. 4D depicts an exemplary truth table used by the state machine in the second exemplary skew compensation circuit. Exemplary operations to be formed by the state machine includes, at 425, sampling the outputs of all the latches. The operations also includes, at 430, determining whether a counter (e.g., 100 clock cycles) has expired. If the counter has not expired, then the state machine decrements the counter at 435, and the method loops back to 430.

If the counter has expired, then, at 440, the state machine detects which of the outputs of all the latches encountered a leading one first. At 445, the corresponding integer value is selected and divided by two, and the ceiling value of the divided value is considered. Based on the truth table, at 450, the state machine then generates a corresponding selection signal in response to the ceiling value.

In this depicted example, the skew compensation circuits are arranged on the same IC (e.g., FPGA) with the channels. In another embodiment, the skew compensation circuits may be implemented in a different IC (e.g., another FPGA) to compensate the lane-to-lane skew. In some embodiments, the skew compensation circuits may be implemented as hard block fixed circuitry. For example, an application specific integrated circuit (ASIC) may provide a skew compensation circuit for lane-to-lane skew compensation with customized hardware circuitry.

In some embodiments, some or all of the functions of the skew compensation circuits may be implemented in a processor (e.g., the processor system) that is configured to execute a set of instructions stored in a data store to control the generation of the user clock signal for the channel. The processor may be arranged on the same integrated circuit, which may be an FPGA with the channels. For example, the flip flips and latches of the skew compensation circuits and the data store may be implemented in a programmable logic block of a system-on-chip (SOC) or implemented in a hard block using fixed circuitry of the SOC, and the state machine may be implemented in another hard block using, for example, fixed circuitry of the SOC.

Figure 5:
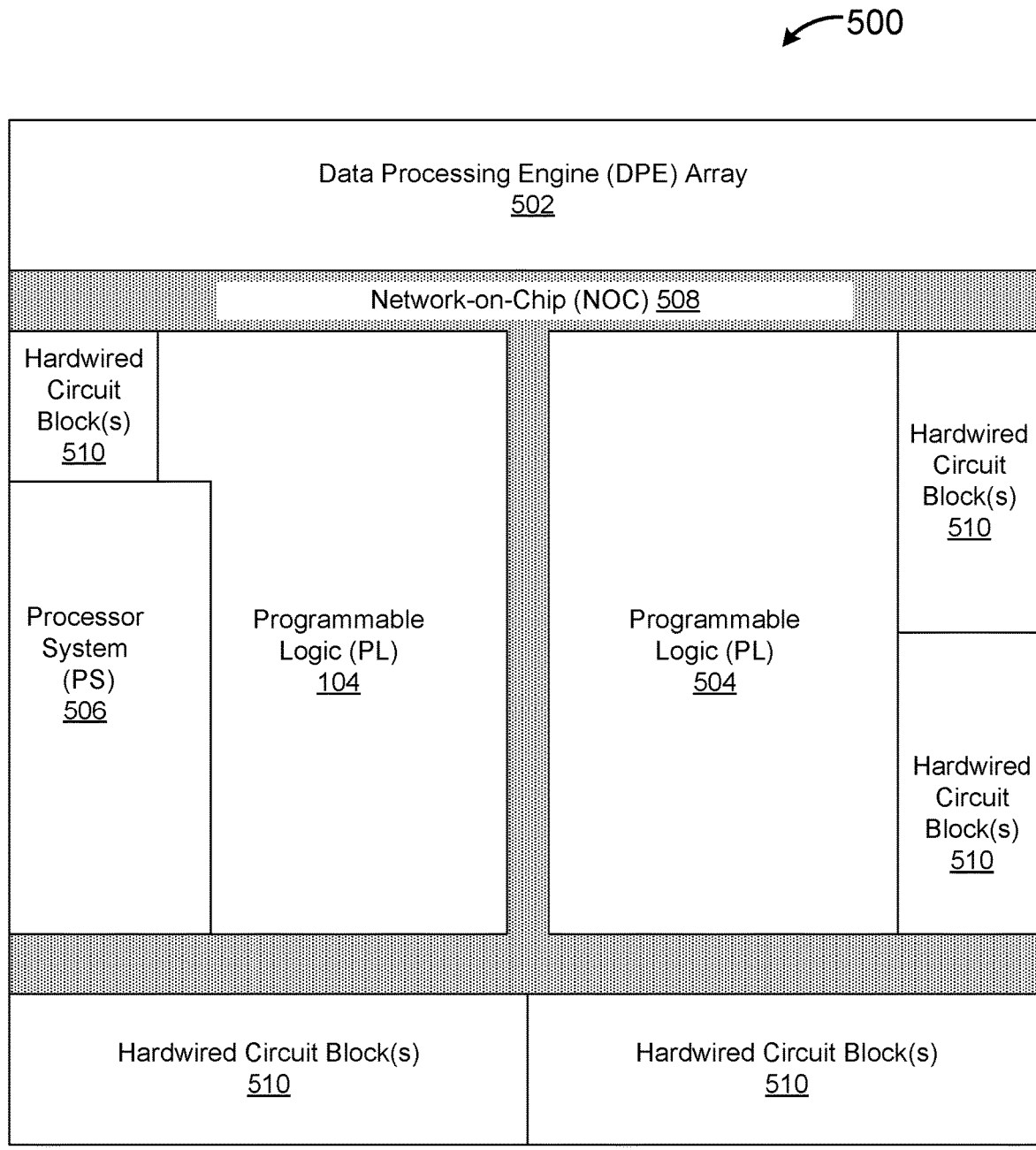
FIG. 5 illustrates another exemplary architecture for a System-on-Chip (SOC) on which the disclosed circuits and processes may be implemented.

FIG. 5 illustrates another exemplary architecture for a System-on-Chip (SOC) on which the disclosed circuits and processes may be implemented. An SOC 500 is an example of a programmable IC and an integrated programmable device platform. In the example of FIG. 5, the various, different subsystems or regions of the SOC 500 illustrated may be implemented on a single die provided within a single integrated package. In other examples, the different subsystems may be implemented on a plurality of interconnected dies provided as a single, integrated package.

In the example, the SOC 500 includes a plurality of regions having circuitry with different functionalities. In the example, the SOC 500 optionally includes a data processing engine (DPE) array 502. The SOC 500 includes programmable logic (PL) regions 504 (hereafter PL region(s) or PL), a processing system (PS) 506, a Network-on-Chip (NOC) 508, and one or more hardwired circuit blocks 510. The DPE array 502 is implemented as a plurality of interconnected, hardwired, and programmable processors having an interface to the other regions of the SOC 500.

The PL 504 is circuitry that may be programmed to perform specified functions. As an example, the PL 504 may be implemented as field programmable gate array type of circuitry. The PL 504 can include an array of programmable circuit blocks. Examples of programmable circuit blocks within PL 504 include, but are not limited to, configurable logic blocks (CLBs), dedicated random access memory blocks (BRAM and/or UltraRAM or URAM), digital signal processing blocks (DSPs), clock managers, and/or delay lock loops (DLLs).

Each programmable circuit block within the PL 504 typically includes both programmable interconnect circuitry and programmable logic circuitry. The programmable interconnect circuitry typically includes a large number of interconnect wires of varying lengths interconnected by programmable interconnect points (PIPs). Typically, the interconnect wires are configured (e.g., on a per wire basis) to provide connectivity on a per-bit basis (e.g., where each wire conveys a single bit of information). The programmable logic circuitry implements the logic of a user design using programmable elements that may include, for example, look-up tables, registers, arithmetic logic, and so forth. The programmable interconnect and programmable logic circuitries may be programmed by loading configuration data into internal configuration memory cells that define how the programmable elements are configured and operate.

The PS 506 is implemented as hardwired circuitry that is fabricated as part of the SOC 500. The PS 506 may be implemented as, or include, any of a variety of different processor types each capable of executing program code. For example, the PS 506 may be implemented as an individual processor, e.g., a single core capable of executing program code. In another example, the PS 506 may be implemented as a multicore processor. In still another example, the PS 506 may include one or more cores, modules, co-processors, interfaces, and/or other resources. The PS 506 may be implemented using any of a variety of different types of architectures. Example architectures that may be used to implement the PS 506 may include, but are not limited to, an ARM processor architecture, an ×86 processor architecture, a GPU architecture, a mobile processor architecture, a DSP architecture, or other suitable architecture that is capable of executing computer-readable instructions or program code.

The NOC 508 includes an interconnecting network for sharing data between endpoint circuits in the SOC 500. The endpoint circuits can be disposed in DPE array 502, PL regions 504, PS 506, and/or in the hardwired circuit blocks 510. The NOC 508 can include high-speed data paths with dedicated switching. In an example, the NOC 508 includes horizontal paths, vertical paths, or both horizontal and vertical paths. The arrangement and number of regions shown in FIG. 5 is merely an example. The NOC 508 is an example of the common infrastructure that is available within the SOC 500 to connect selected components and/or subsystems.

The NOC 508 provides connectivity to the PL 504, the PS 506, and to selected ones of the hardwired circuit blocks 510. The NOC 508 is programmable. In the case of a programmable the NOC used with other programmable circuitry, the nets that are to be routed through the NOC 508 are unknown until a user circuit design is created for implementation within the SOC 500. The NOC 508 may be programmed by loading configuration data into internal configuration registers that define how elements within The NOC 508 such as switches and interfaces are configured and operate to pass data from switch to switch and among the NOC interfaces.

The NOC 508 is fabricated as part of the SOC 500 and while not physically modifiable, may be programmed to establish connectivity between different master circuits and different slave circuits of a user circuit design. The NOC 508, for example, may include a plurality of programmable switches that are capable of establishing packet switched network connecting user specified master circuits and slave circuits. In this regard, the NOC 508 is capable of adapting to different circuit designs, where each different circuit design has different combinations of master circuits and slave circuits implemented at different locations in the SOC 500 that may be coupled by the NOC 508. The NOC 508 may be programmed to route data, e.g., application data and/or configuration data, among the master and slave circuits of the user circuit design. For example, the NOC 508 may be programmed to couple different user-specified circuitry implemented within the PL 504 with the PS 506, and/or the DPE array 502, with different hardwired circuit blocks, and/or with different circuits and/or systems external to the SOC 500.

The hardwired circuit blocks 510 may include input/output (I/O) blocks, and/or transceivers for sending and receiving signals to circuits and/or systems external to the SOC 500, memory controllers, or the like. Examples of different I/O blocks may include single-ended and pseudo differential I/Os and high-speed differentially clocked transceivers. Further, the hardwired circuit blocks 510 may be implemented to perform specific functions. Examples of hardwired circuit blocks 510 include, but are not limited to, cryptographic engines, digital-to-analog converters, analog-to-digital converters, and the like. The hardwired circuit blocks 510 within the SOC 500 may be referred to herein from time-to-time as application-specific blocks.

In the example of FIG. 5, the PL 504 is shown in two separate regions. In another example, the PL 504 may be implemented as a unified region of programmable circuitry. In still another example, the PL 504 may be implemented as more than two different regions of programmable circuitry. The particular organization of the PL 504 is not intended as a limitation. In this regard, the SOC 500 includes one or more PL regions 504, the PS 506, and the NOC 508. The DPE array 502 may be optionally included.

In other example implementations, the SOC 500 may include two or more DPE arrays 502 located in different regions of the IC. In still other examples, the SOC 500 may be implemented as a multi-die IC. In that case, each subsystem may be implemented on a different die. The different dies may be communicatively linked using any of a variety of available multi-die IC technologies such stacking the dies side-by-side on an interposer, using a stacked-die architecture where the IC is implemented as a Multi-Chip Module (MCM), or the like. In the multi-die IC example, it should be appreciated that each die may include single subsystem, two or more subsystems, a subsystem and another partial subsystem, or any combination thereof.

A programmable integrated circuit (IC) refers to a type of device that includes programmable logic. An example of a programmable device or IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLs). Modern programmable ICs have evolved to include programmable logic in combination with one or more other subsystems. For example, some programmable ICs have evolved into System-on-Chips or "SOCs" that include both programmable logic and a hardwired processor. Other varieties of programmable ICs include additional and/or different subsystems.

Although various embodiments may be implemented using reconfigurable programmable logic blocks (e.g., FPGA), other embodiments may be implemented in fixed instantiations (e.g., ASIC), or combined in a single integrated circuit (e.g., SOC) with programmable logic. While dedicated hard block circuitry in an ASIC implementation may not be reconfigurable once instantiated in an integrated circuit, for example, an ASIC implementation may, in some implementations, provide for a minimized platform with respect to, for example, power consumption and/or die area.

Although various embodiments have been described with reference to the figures, other embodiments are possible. For example, the transmitter may only include one skew compensation circuit that can be configured to generate the same user clock signal for all the channels in the transmitter. The application of the skew reduction technique is not limited to reducing serial lane skew requirements. For example, in some embodiments, the skew reduction technique may be used for multiple physical design blocks which share a common clock with external routings.

Various examples may be implemented using circuitry, including various electronic hardware. By way of example and not limitation, the hardware may include transistors, resistors, capacitors, switches, integrated circuits and/or other devices. In various examples, the circuits may include analog and/or digital logic, discrete components, traces and/or memory circuits fabricated on a silicon substrate including various integrated circuits (e.g., FPGAs, ASICs). In some embodiments, the circuits may involve execution of preprogrammed instructions and/or software executed by a processor. For example, various systems may involve both hardware and software.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a fixed hardware processor; and methods can be performed by a programmable processor executing a program of instructions to perform functions of various embodiments by operating on input data and generating an output. Some embodiments may be implemented advantageously in one or more computer programs that are executable on a programmable system including at least one processor coupled to receive data and instructions from, and to transmit data and instructions to, a data store, at least one input, and/or at least one output. A data store may include one or more registers or memory locations in, for example, a memory space. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:
1. An integrated circuit (IC) comprising:
a plurality of N skew compensation circuits configured to receive, through a first plurality of routing traces, an initial reference clock signal, each routing trace of the first plurality of routing traces introduces a corresponding first delay to the initial reference clock signal; and, a second plurality of routing traces, coupled between an $i^{th}$ skew compensation circuit and an $(i-1)^{th}$ skew compensation circuit, configured to send the corresponding first delayed reference clock signal received by an $i^{th}$ skew compensation circuit to the $(i-1)^{th}$ skew compensation circuit, each routing trace of the second plurality of routing traces introduces a corresponding second delay to the corresponding first delayed reference clock signal, $2 \leq i \leq N$, wherein the $(i-1)^{th}$ skew compensation circuit is further configured to receive the corresponding first delayed reference clock signal and the corresponding second delayed reference clock signal to generate a corresponding user clock signal for a corresponding transmitter lane of a plurality of N parallel transmitter lanes, each transmitter lane of the plurality of N parallel transmitter lanes configured to receive the corresponding user clock signal having substantially the same delay relative to the initial reference clock signal.

2. The IC of claim 1, wherein each skew compensation circuit of the plurality of N skew compensation circuits comprises:
   a first selection circuit configured to receive a feedback clock signal and the corresponding second delayed reference clock signal to generate a first selected clock signal in response to a first selection signal;
   a phase detector configured to receive the corresponding first delayed reference clock signal and the first selected clock signal to generate an indication signal;
   a charge pump circuit configured to receive the indication signal and generate a voltage signal;
   a low pass filter configured to receive the voltage signal and generate a filtered voltage signal;
   a voltage controlled delay logic (VCDL) configured to receive the corresponding first delayed reference clock signal and generate the feedback clock signal in response to the filtered voltage signal; and,
   a second selection circuit configured to receive the feedback clock signal and an output clock signal to generate a second selected clock signal as the corresponding user clock signal in response to a second selection signal.

3. The IC of claim 2, wherein the VCDL comprises an analog delay line.

4. The IC of claim 2, wherein the VCDL comprises a digital delay line.

5. The IC of claim 2, wherein the first selection circuit is configured to output the corresponding second delayed reference clock signal as the first selected clock signal at the start of the operation of the IC.

6. The IC of claim 2, wherein the second selection circuit is configured to output the output clock signal as the corresponding user clock signal to bypass the IC.

7. The IC of claim 2, wherein the phase detector is configured to compute a phase difference between its two received signals and generate the indication signal to indicate a leading status or a lagging status.

8. The IC of claim 2, wherein the charge pump circuit comprises a capacitor having a capacitance value that is twice its original capacitance value.

9. An integrated circuit (IC) comprising:
   a plurality of N parallel transmitter lanes, each transmitter lane of the plurality of N parallel transmitter lanes configured to receive a corresponding user clock signal;
   a plurality of N skew compensation circuits configured to receive, through a first plurality of routing traces, an initial reference clock signal, each routing trace of the first plurality of routing traces introduces a corresponding first delay to the initial reference clock signal; and,
   a second plurality of routing traces, coupled between an $i^{th}$ skew compensation circuit and an $(i-1)^{th}$ skew compensation circuit, configured to send the corresponding first delayed reference clock signal received by the $i^{th}$ skew compensation circuit to the $(i-1)^{th}$ skew compensation circuit, each routing trace of the second plurality of routing traces introduces a corresponding second delay to the corresponding first delayed reference clock signal, $2 \leq i \leq N$, wherein the $(i-1)^{th}$ skew compensation circuit is further configured to receive the corresponding first delayed reference clock signal and a corresponding second delayed reference clock signal to generate the corresponding user clock, the corresponding user clock signal received by an $(i-1)^{th}$ transmitter lane and the corresponding user clock signal received by an $i^{th}$ transmitter lane are substantially the same user clock signal.

10. The IC of claim 9, wherein each skew compensation circuit of the plurality of N skew compensation circuits comprises:
   a plurality of N delay buffers connected in series to receive the corresponding first delayed clock signal and generate a plurality of N delayed signals;
   a plurality of N flip flops, wherein each flip flop of the plurality of N flip flops is clocked by a corresponding delayed signal of the plurality of N delayed signals;
   a plurality of N latches, each latch of the plurality of N latches configured to receive a corresponding output of a corresponding flip flop of the plurality of N flip flops as a corresponding enable signal;
   a state machine configured to receive the corresponding output of each latch and generate a selection signal; and,
   a selection circuit configured to receive the plurality of N delayed signals and output a delay signal in response to the selection signal.

11. The IC of claim 10, wherein each buffer of the plurality of N delay buffers is assigned a corresponding weight.

12. The IC of claim 11, wherein the state machine is configured to generate the selection signal in response to a first encountered leading digital 1 among the corresponding outputs of the plurality of N latches.

13. The IC of claim 11, wherein the state machine is configured to divide the corresponding weight assigned to the delayed signal which has the first encountered leading digital 1 by a factor of two, generate a ceiling value of the divided weight, and then generate the selection signal in response to a predetermined truth table.

14. The IC of claim 10, wherein the plurality of N latches are negatively triggered.

15. The IC of claim 10, wherein the plurality of N flip flops comprise D-type flip flops.

16. A method of reducing lane-to-lane clock skew in an integrated circuit (IC), the method comprising:
   routing each compensation circuit of a plurality of N skew compensation circuits to receive, through a first plurality of routing traces, an initial reference clock signal, wherein each routing trace of the first plurality of routing traces introduces a corresponding first delay to the initial reference clock signal;
   routing an $i^{th}$ skew compensation circuit with an $(i-1)^{th}$ skew compensation circuit, through a second plurality of routing traces, to send the corresponding first delayed reference clock signal received by the $i^{th}$ skew compensation circuit to the $(i-1)^{th}$ skew compensation circuit, each routing trace of the second plurality of routing traces introduces a corresponding second delay to the corresponding first delayed reference clock signal, $2 \leq i \leq N$; and, forming a corresponding skew compensation circuit of a plurality of N skew compensation circuits to:

calculate a skew amount between the corresponding first delayed reference clock signal and the corresponding second delayed reference clock signal for each lane; and, divide the calculated skew amount by a predetermined factor and apply the divided skew amount to the corresponding first delayed reference clock signal to generate a corresponding user clock signal for each corresponding lane of the transmitter.

17. The method of claim 16, wherein forming the corresponding skew compensation circuit comprises:

providing a first selection circuit to receive a feedback clock signal and the corresponding second delayed reference clock signal to generate a first selected clock signal in response to a first selection signal;

configuring a phase detector to receive the corresponding first delayed reference clock signal and the first selected clock signal to generate an indication signal;

providing a charge pump circuit to receive the indication signal and generate a voltage signal; and, configuring a voltage controlled delay logic (VCDL) to receive the corresponding first delayed reference clock signal and generate the feedback clock signal in response to the voltage signal.

18. The method of claim 17, wherein forming the corresponding skew compensation circuit further comprises:

configuring a second selection circuit to receive the feedback clock signal and an output clock signal to generate a second selected clock signal as the corresponding user clock signal in response to a second selection signal.

19. The method of claim 17, wherein forming the corresponding skew compensation circuit further comprises: configuring the phase detector to compute a phase difference between its two received signals and generate the indication signal to indicate a leading status or a lagging status.

20. The method of claim 17, wherein the charge pump circuit comprises a capacitor having a capacitance value that is twice its original capacitance value.

\* \* \* \* \*